(12) United States Patent
Oyama

(10) Patent No.: US 7,246,429 B2
(45) Date of Patent: Jul. 24, 2007

(54) ELECTRONIC COMPONENT MOUNTING APPARATUS

(75) Inventor: Kazuyoshi Oyama, Ashikaga (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 455 days.

(21) Appl. No.: 10/691,973

(22) Filed: Oct. 24, 2003

(65) Prior Publication Data

US 2004/0139597 A1    Jul. 22, 2004

(30) Foreign Application Priority Data

Oct. 25, 2002   (JP)  .............................. 2002-311024

(51) Int. Cl.
B23P 19/00  (2006.01)
(52) U.S. Cl. ............................ 29/740; 29/720; 29/739; 29/832; 348/87; 348/95
(58) Field of Classification Search ................. 29/739, 29/740, 832, 720; 348/87, 95
See application file for complete search history.

(56) References Cited

U.S. PATENT DOCUMENTS 3,899,634 A * 8/1975 Montone et al. .............. 348/95
3,988,535 A * 10/1976 Hickman et al. ............. 348/87
5,911,456 A * 6/1999 Tsubouchi et al. ............ 29/833
5,926,950 A * 7/1999 Asai et al. ..................... 29/832

FOREIGN PATENT DOCUMENTS

JP          06-085492          3/1994

* cited by examiner

Primary Examiner—Richard Chang
(74) Attorney, Agent, or Firm—Morrison & Foerster LLP

(57) ABSTRACT

The invention is directed to performing of an effective checking and aligning operation of component pick-up positions at component feeding units used for manufacturing by performing the operation sequentially at a time. A board recognition camera takes an image of a feeding position of a component feeding unit and the image is displayed being superimposed over a graphic image of a suction nozzle on a CRT. When an operator operates a trackball to move a cursor to an "execute visual alignment" menu and clicks a left button there, the stored image (memory image) becomes movable freely in any direction according to a trackball operation. The stored image (memory image) is moved to match a cross line and an outline of a graphic suction nozzle (component pick-up position) for visual alignment with a component feeding position. Then, the operator clicks both right and left buttons of the trackball to store an alignment value of the position in a RAM.

5 Claims, 20 Drawing Sheets

Mounting Data

| Step No. | X abscissa | Y ordirate | Angle | Alignment No.(Component ID) |
|---|---|---|---|---|
| 001 | X1 | Y1 | θ1 | 101 (P001) |
| 002 | X2 | Y2 | θ2 | 102 (P002) |
| 003 | X3 | Y3 | θ3 | 103 (P003) |
| ⋮ | ⋮ | ⋮ | ⋮ | ⋮ |

ELECTRONIC COMPONENT MOUNTING APPARATUS

BACKGROUND OF THE INVENTION

1. Field of the Invention

The invention relates to an electronic component mounting apparatus which has a plurality of component feeding units for feeding electronic components, being aligned on a base, and a mounting head provided with suction nozzles, being movable between the component feeding units and a printed board, where the suction nozzles pick the electronic components up from the component feeding units.

2. Description of the Related Art

A conventional electronic component mounting apparatus of this type is called a multifunctional electronic component mounting apparatus. Control of component pick-up positions is important in this mounting apparatus, particularly for mounting micro-sized electronic components. Therefore, a board recognition camera is mounted on a movable beam and is utilized for monitoring the pick-up positions and informing a CPU of visual alignment thereof.

There is disclosed a technology in which information of aligned positions at component feeding positions is recognized by and stored in a component feeding position recognition camera predetermined times before component mounting operation. Then, subsequent component pick-up positions are aligned based on the stored information, thereby minimizing adverse effects caused by a difference in size between each of the component feeding units and storage tapes (for example, Japanese Patent Application Publication No. Hei 6-85492).

Monitoring of the pick-up positions and informing of the visual alignment thereof are performed in each of the component feeding units aligned on a base one by one. Here, an informing method of a component pick-up position of the conventional art will be described with reference to FIGS. 22 and 23. The number of a component feeding unit to be informed of is specified and an informing mode is executed. Then, an electronic component mounting apparatus moves a board recognition camera mounted on a beam to a specified pick-up position and makes the camera take an image thereof. A graphic double circle having size of a suction nozzle (external diameter, internal diameter) specified for suction are displayed, being superimposed over the stored image together with a center O (a targeted center position) of the suction nozzle for suction and a cross line C (FIG. 22). An operator decides whether or not the component pick-up position is appropriate. If alignment of the position is needed, the stored image is moved to align it to a proper position by operating a trackball (FIG. 23), and informing of visual alignment is executed. Offset data of the pick-up position in the specified component feeding unit is updated based on a shift amount ($\Delta x$, $\Delta y$) of the image.

Informing of visual alignment which is executed one by one in each of the component feeding units aligned on the base causes wasting of time for setting up of the apparatus for manufacturing a printed board of a new type before running.

SUMMARY OF THE INVENTION

The invention provides an electronic component mounting apparatus that includes a plurality of component feeding units feeding electronic components and aligned on a base, and a mounting head provided with suction nozzles. The mounting head is movable between the component feeding units and a printed board positioning portion, and the suction nozzles pick the electronic components up from the component feeding units. The apparatus also includes a recognition camera taking images of component feeding positions of the component feeding units, a command device commanding the recognition camera to sequentially take images of the component feeding positions of the component feeding units, and a display device displaying each of the images taken by the recognition camera with a graphic image of a component pick-up position. The apparatus also includes a position matching device for matching the component feeding positions with the corresponding component pick-up positions by moving the image taken or the graphic image on the display device for visual alignment, a storage portion storing shift amounts detected by the position matching device, and a control device controlling alignments of the component pick-up positions with respect to the suction nozzles based on the shift amounts stored in the storage portion.

DETAILED DESCRIPTION OF THE INVENTION

Figure 1:
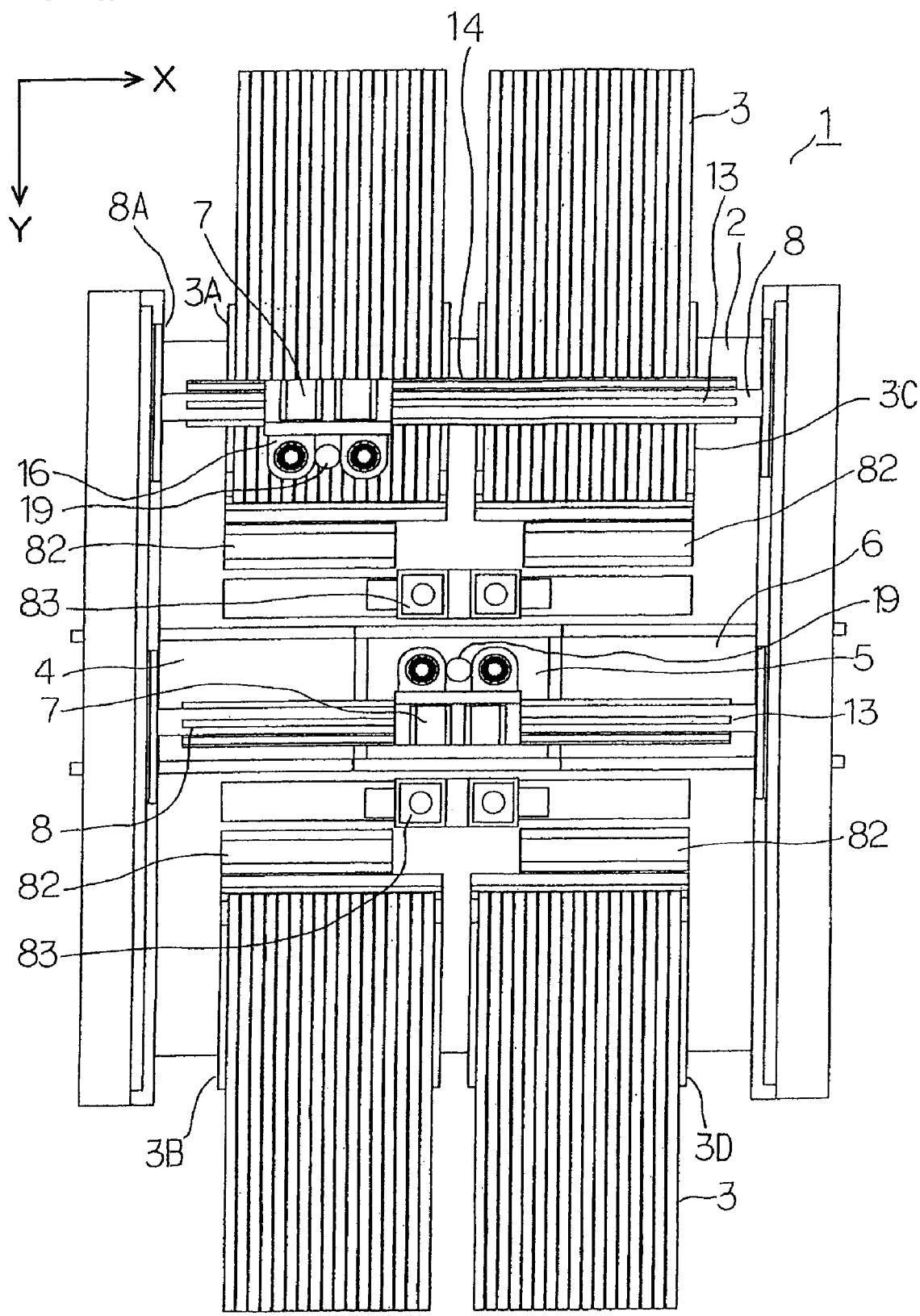
FIG. 1 is a plan view of an electronic component mounting apparatus of an embodiment of the invention.
Figure 2:
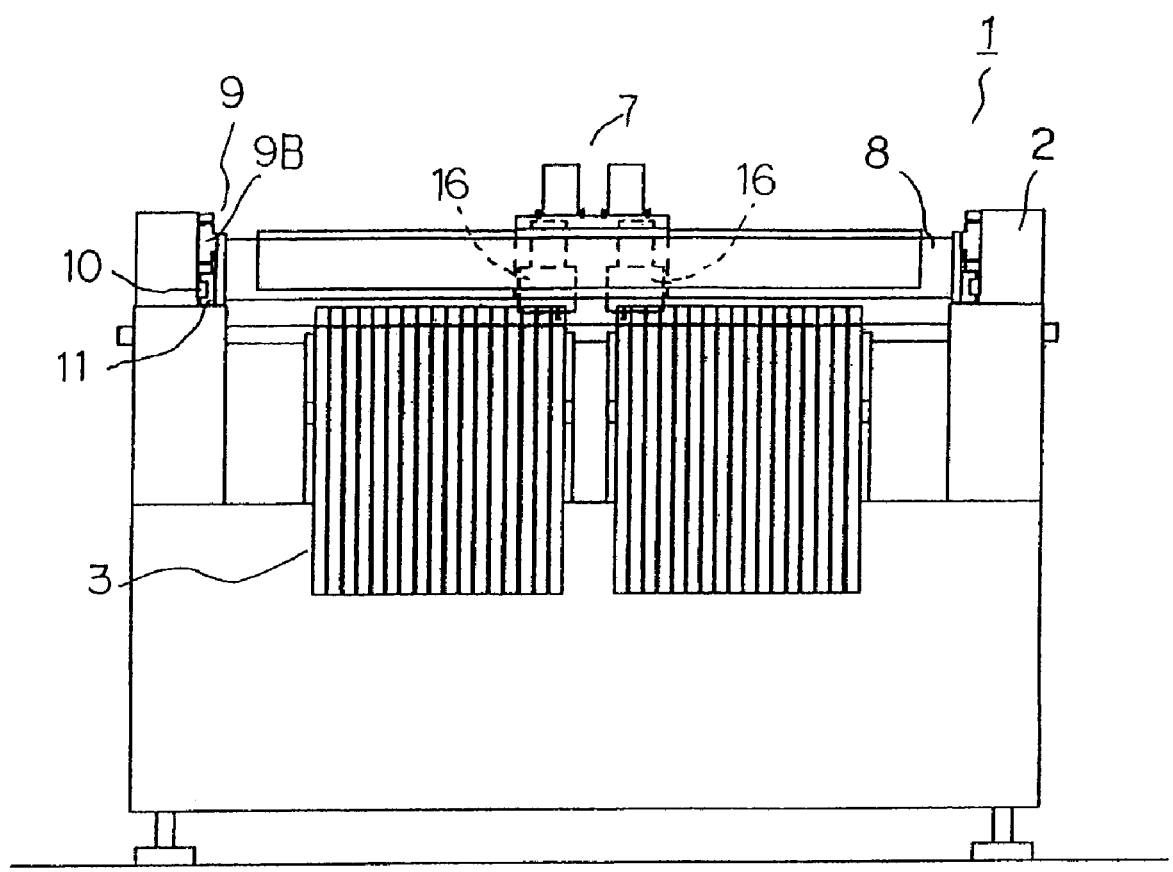
FIG. 2 is a front view of the electronic component mounting apparatus of FIG. 1.
Figure 3:
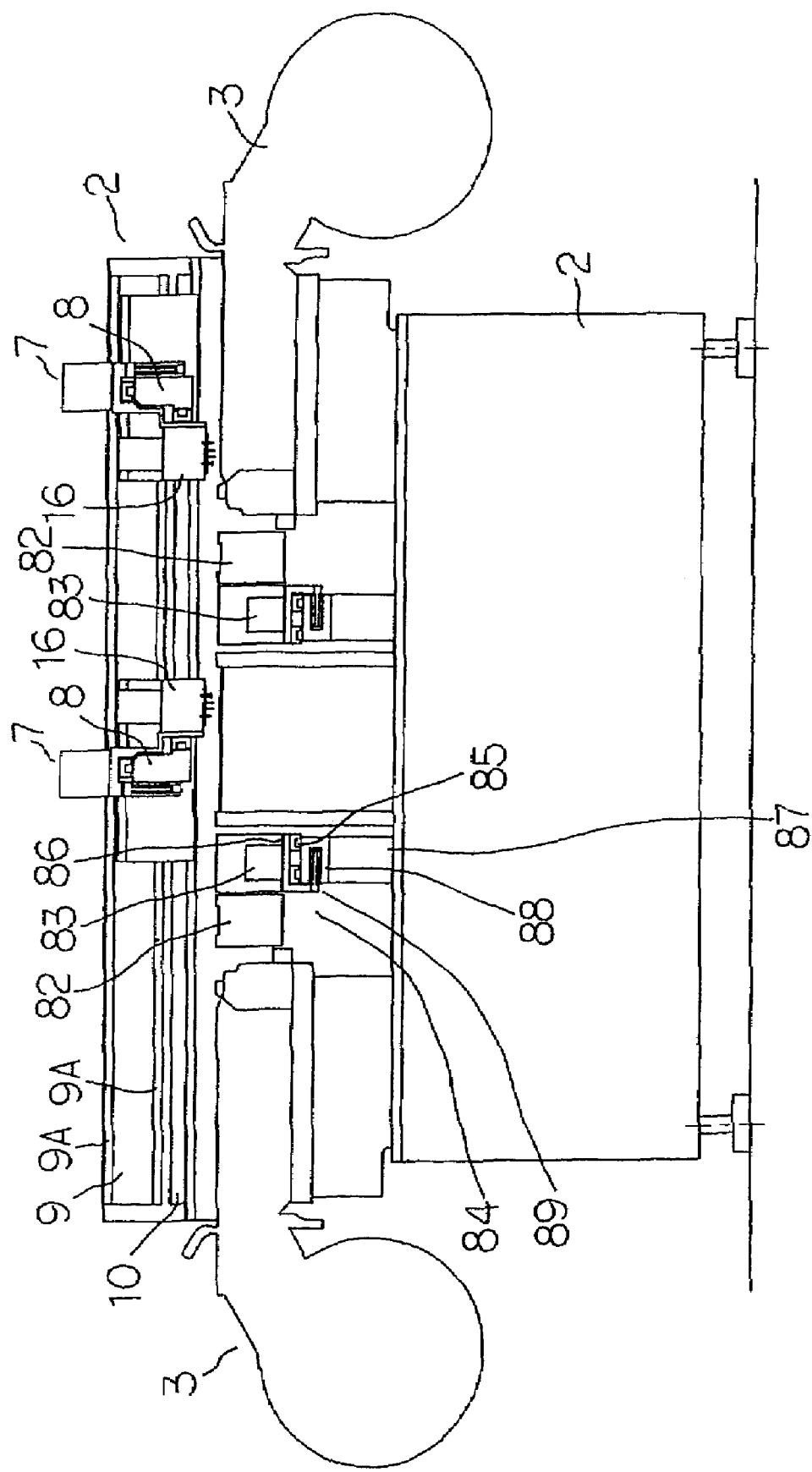
FIG. 3 is a right side view of the electronic component mounting apparatus of FIG. 1.

An embodiment of an electronic component mounting apparatus of the invention will be described with reference to the drawings. FIG. 1 is a plan view of an electronic component mounting apparatus 1, FIG. 2 is a front view of the electronic component mounting apparatus 1, and FIG. 3 is a right side view of the electronic component mounting apparatus 1. A plurality of component feeding units 3 for feeding a variety of components one by one to each of component feeding positions (component pick-up positions) is detachably aligned and fixed on feeder bases 3A, 3B, 3C, and 3D on a base 2 in the apparatus 1. A feed conveyer 4, a positioning portion 5, and a discharge conveyer 6 are provided between groups of the units 3 facing to each other. The feed conveyer 4 conveys a printed board P received from an upstream to the positioning portion 5, an electronic component is mounted on the printed board P positioned by a positioning device (not shown) in the positioning portion 5, and the printed board P is conveyed to the discharge conveyer 6.

A numeral 8 designates a pair of beams extending in an X direction. Each of the beams 8 respectively moves in a Y direction above the printed board P on the positioning portion 5 or the component feeding positions (component pick-up positions) of the component feeding units 3 as sliders 11 fixed to each of the beams 8 slide along a pair of left and right guides 10, driven by each of linear motors 9. Each of the linear motors 9 has a pair of upper and lower stationary members 9A fixed on the base 2 and a moving member 9B fixed to a lower part of an attachment board 8A provided on each end of the beam 8.

Each of the beams 8 is provided with a mounting head body 7 which moves in a longitudinal direction, i.e., in the X direction along guides 13 driven by the linear motor 14. The linear motor 14 has a pair of front and back stationary members 14A fixed to the beam 8 and a moving member 14B provided on the mounting head body 7. Each of the mounting head bodies 7 has two mounting heads 16 having twelve suction nozzles 15 each fixed to and pulled up by each of twelve springs 12. A board recognition camera 19 is provided between the mounting heads 16 in each of the mounting head bodies 7 and takes an image at a positioning mark (not shown) on the printed board P positioned on the positioning portion 5.

Figure 5:
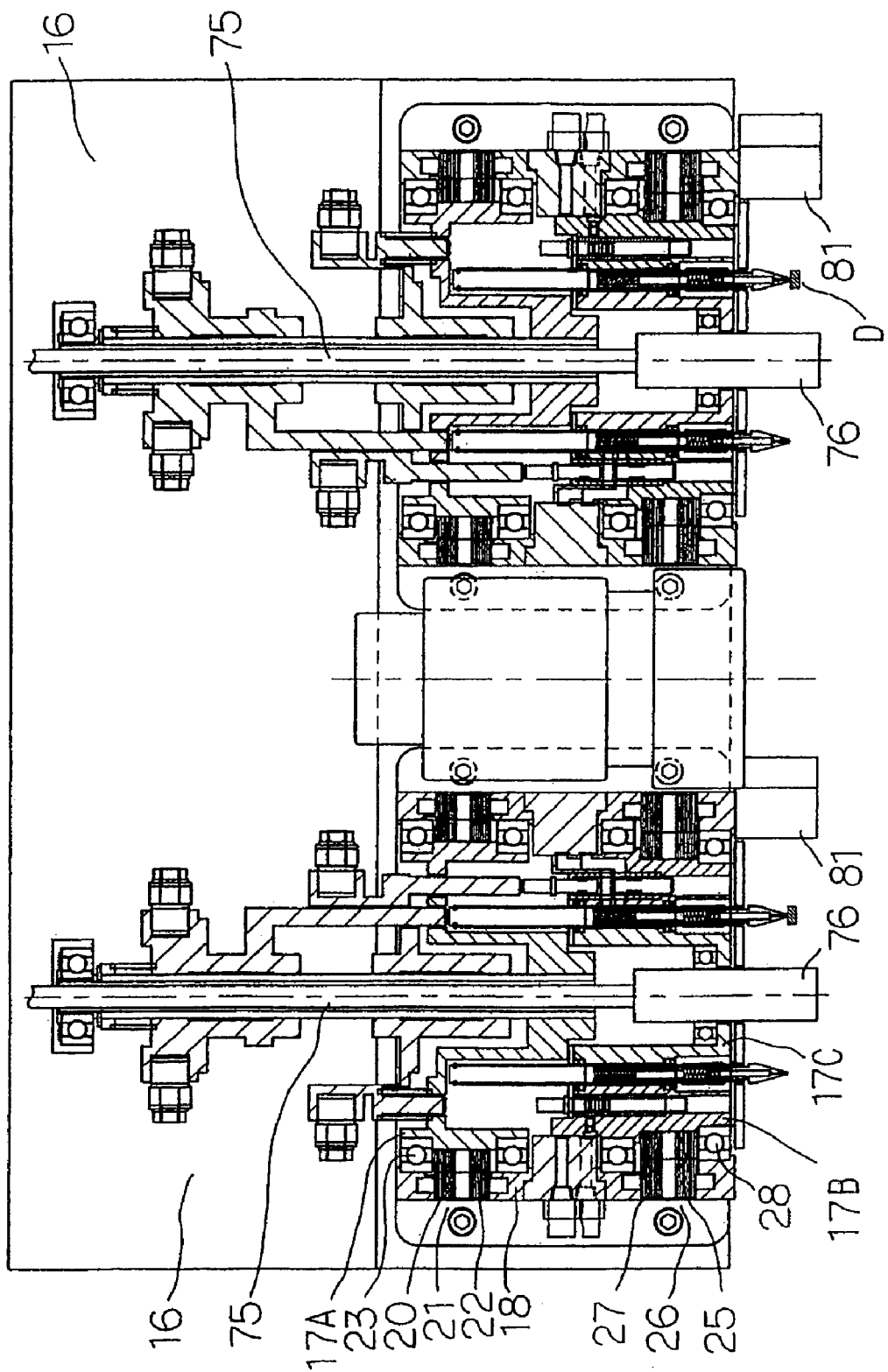
FIG. 5 is a vertical front view of a mounting head body of the apparatus of FIG. 1.
Figure 6:
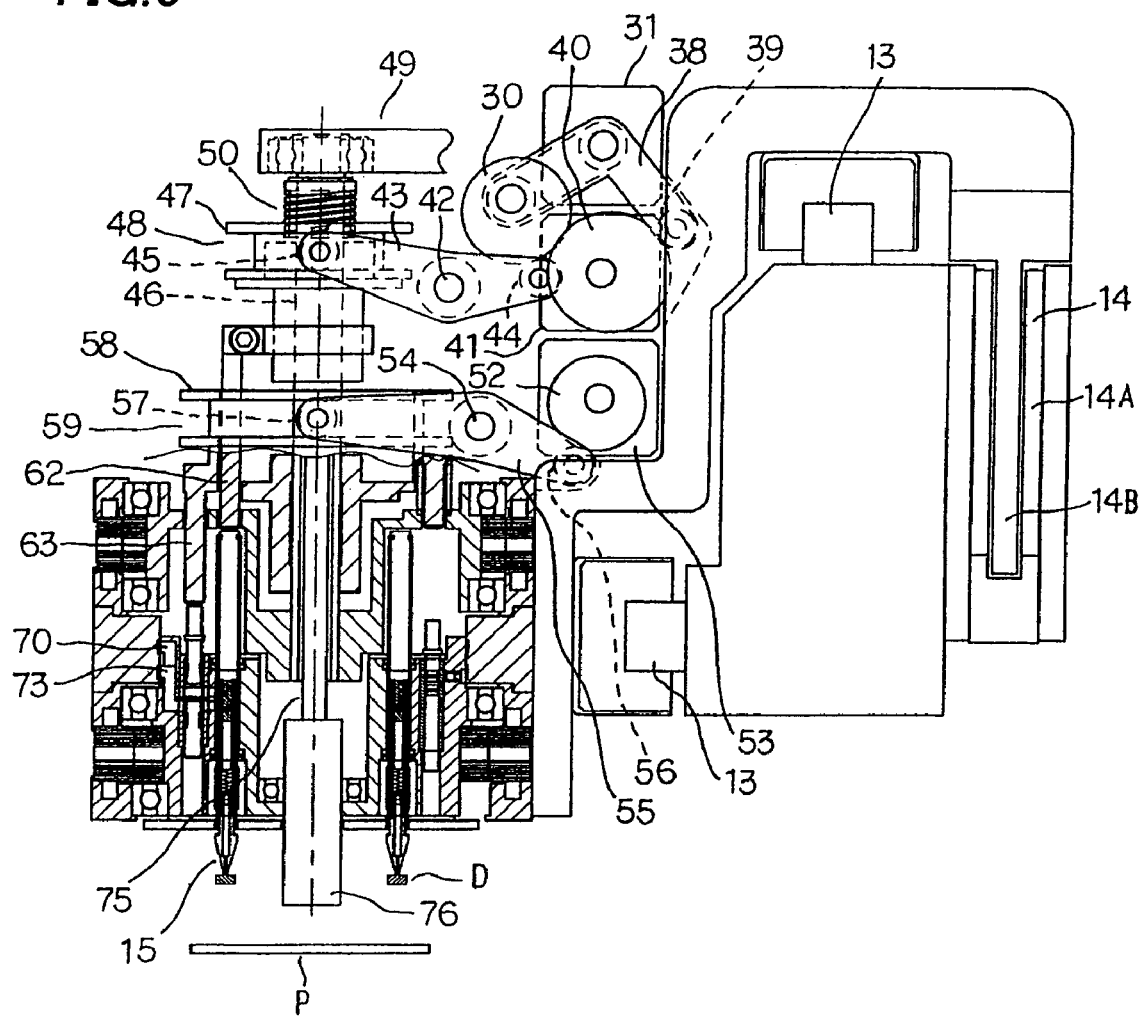
FIG. 6 is a vertical side view of the mounting head body of FIG. 4 picking a thin electronic component up by suction.

The mounting head 16 will be described with reference to FIGS. 5 and 6. A numeral 20 designates a rotor of a pulse motor 21 which is provided in an upper part of a first inner cylinder 17A and rotatable in a θ direction being contact with bearings 23 inside a stator 22 provided in an outer cylinder 18 fixed to the mounting head body 7. A numeral 25 designates a rotor of a pulse motor 26 which is provided in a lower part of a second inner cylinder 17B and rotatable in a θ direction being contact with bearings 28 inside a stator 27 provided in the outer cylinder 18 fixed to the mounting head body 7. Twelve suction nozzles 15 are provided on a circumference of a circle at predetermined intervals inside the second inner cylinder 17B, being movable upward and downward.

Figure 10:
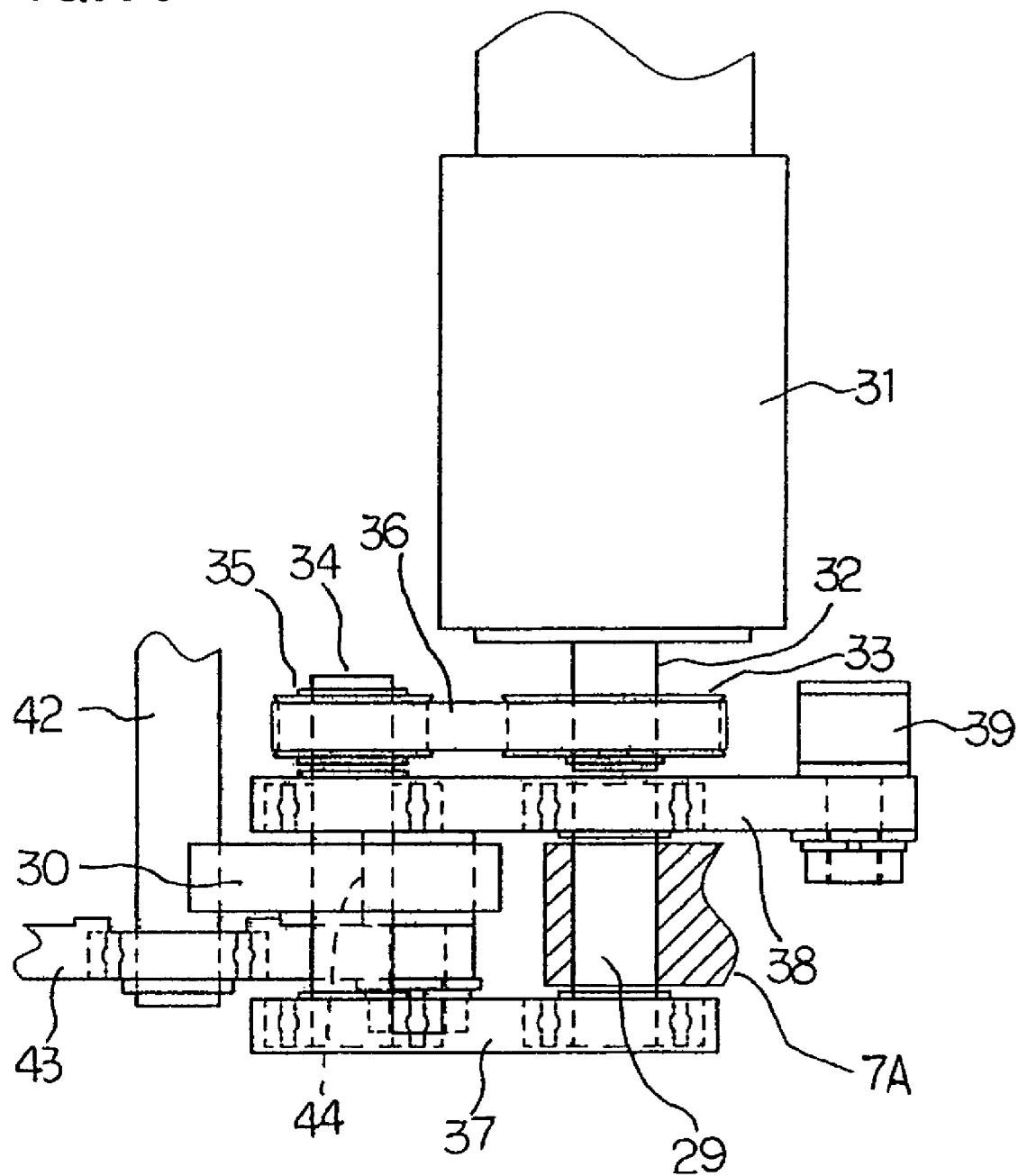
FIG. 10 is a plan view of a first cam and a first lever of the apparatus of FIG. 1.
Figure 11:
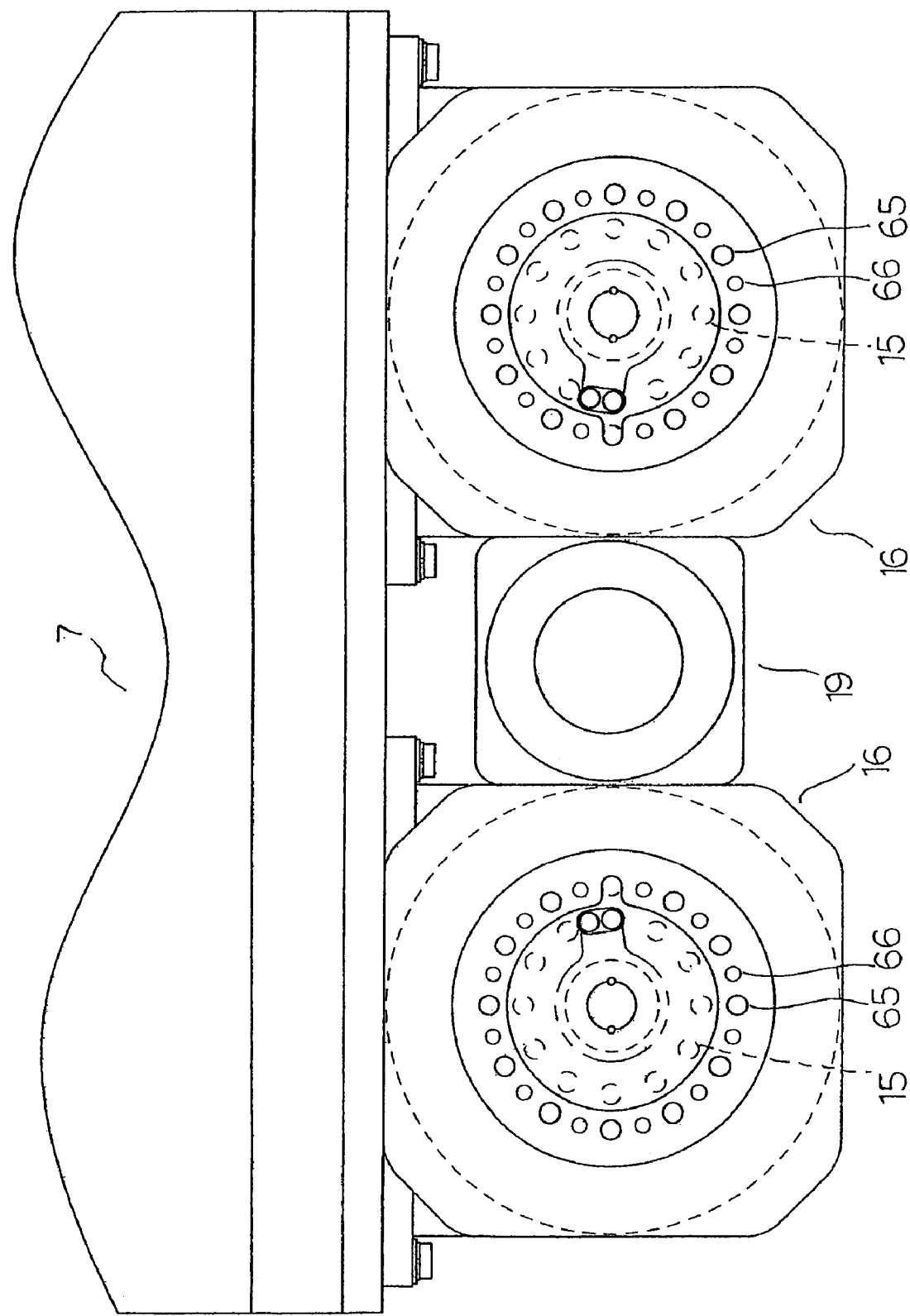
FIG. 11 is a plan view of the mounting head body of FIG. 4.
Figure 12:
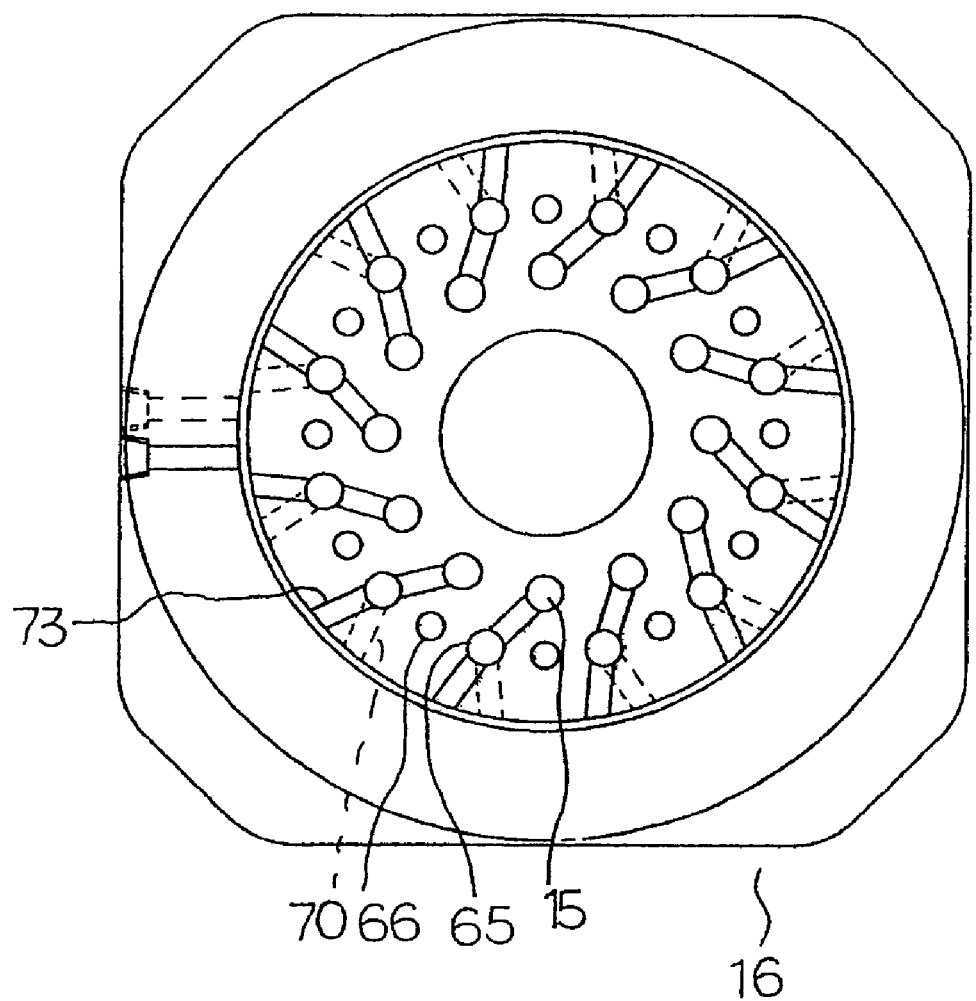
FIG. 12 is a schematic plan view explaining vacuum suction for picking-up or air blowing for mounting by the suction nozzle employed in the apparatus of FIG. 1.

A numeral 30 designates a first cam which makes a basic up-and-down stroke of the suction nozzles 15. The first cam 30 which is fixed to a follower axis 34 rotates by a belt 36 stretched between a pulley 33 provided on a driving axis 32 and a pulley 35 provided on the follower axis 34, driven by a drive motor 31 (FIG. 10). A cam follower 39 is provided on one side of a first lever 38 which is rotatable around a support axis 29 supported by a support portion 7A extending from the mounting head body 7. The support axis 29 and the follower axis 34 are connected with a connecting lever 37.

A numeral 40 designates a second cam which rotates driven by a drive motor 41 and makes an aligned up-and-down stroke of the suction nozzles 15 corresponding to a thickness of an electronic component. The cam follower 39 is pressed into contact with a circumference of the second cam 40. A cam follower 44 is provided on one end of the second lever 43 which turns around a support axis 42, and is pressed into contact with a circumference of the first cam 30. A cam follower 45 is provided on another end of the second lever 43, and engaged with a cam engagement portion 48 of a vertical shift body 47 which is movable upward and downward along a strut 46 which is a center of θ rotation of the mounting head 16. A spring 50 is interposed between the vertical shift body 47 and a support body 49, and pressurizes the vertical shift body 47 downward.

A numeral 52 designates a third cam for switching a vacuum valve, which rotates driven by the drive motor 53. A cam follower 56 on one end of a third lever 55 which turns around a support axis 54 is pressed into contact with the third cam 52. A cam follower 57 on another end of the third lever 55 is engaged with a cam engagement portion 59 of a vacuum valve switch operating body 58 which is movable upward and downward corresponding to movement of the vertical shift body 47.

The vertical shift body 47 is provided with a vertical shift bar 62 for raising and lowering the suction nozzles 15. By rotation of the first cam 30 and the second cam 40, the first lever 38 and the second lever 43 turn around the support axis 29 and the support axis 42 respectively. Then, the vertical shift body 47 descends and the vertical shift bar 62 lowers the suction nozzles 15 by a predetermined stroke corresponding to a thickness of an electronic component D, thus completing mounting of the electronic component D on the printed board P.

Figure 7:
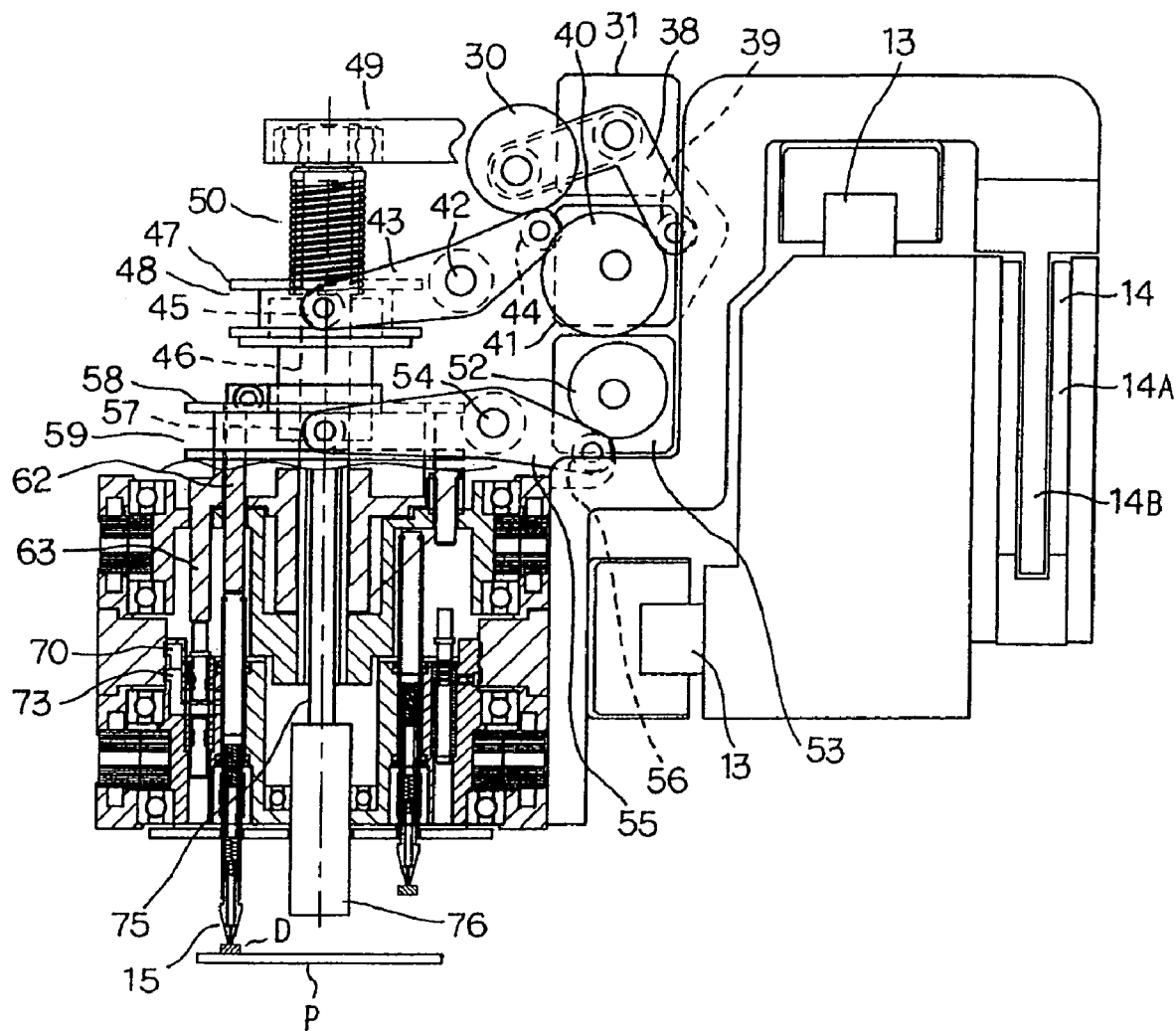
FIG. 7 is a vertical side view of the mounting head body of FIG. 4 mounting the thin electronic component.
Figure 8:
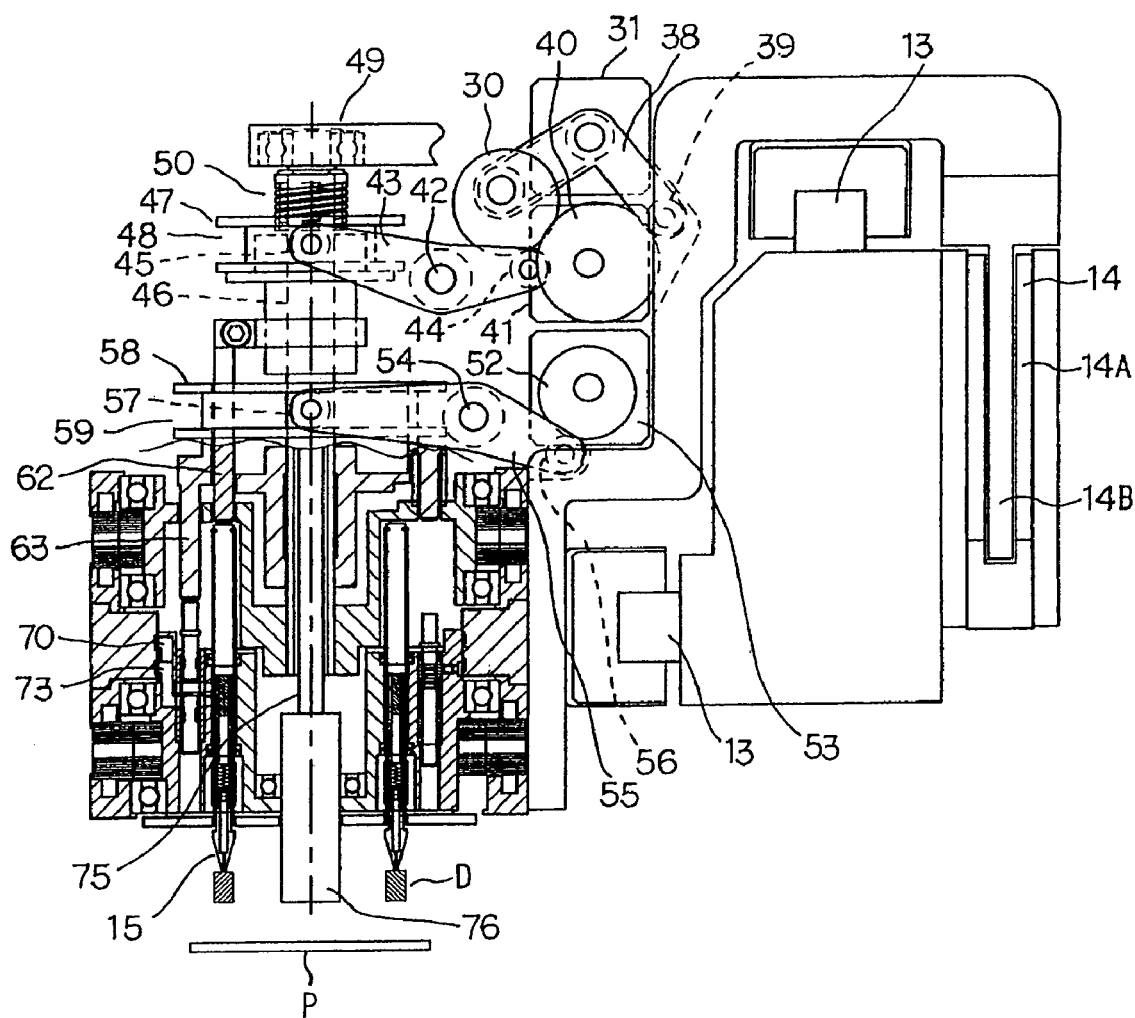
FIG. 8 is a vertical side view of the mounting head body of FIG. 4 picking a thick electronic component up by suction.
Figure 9:
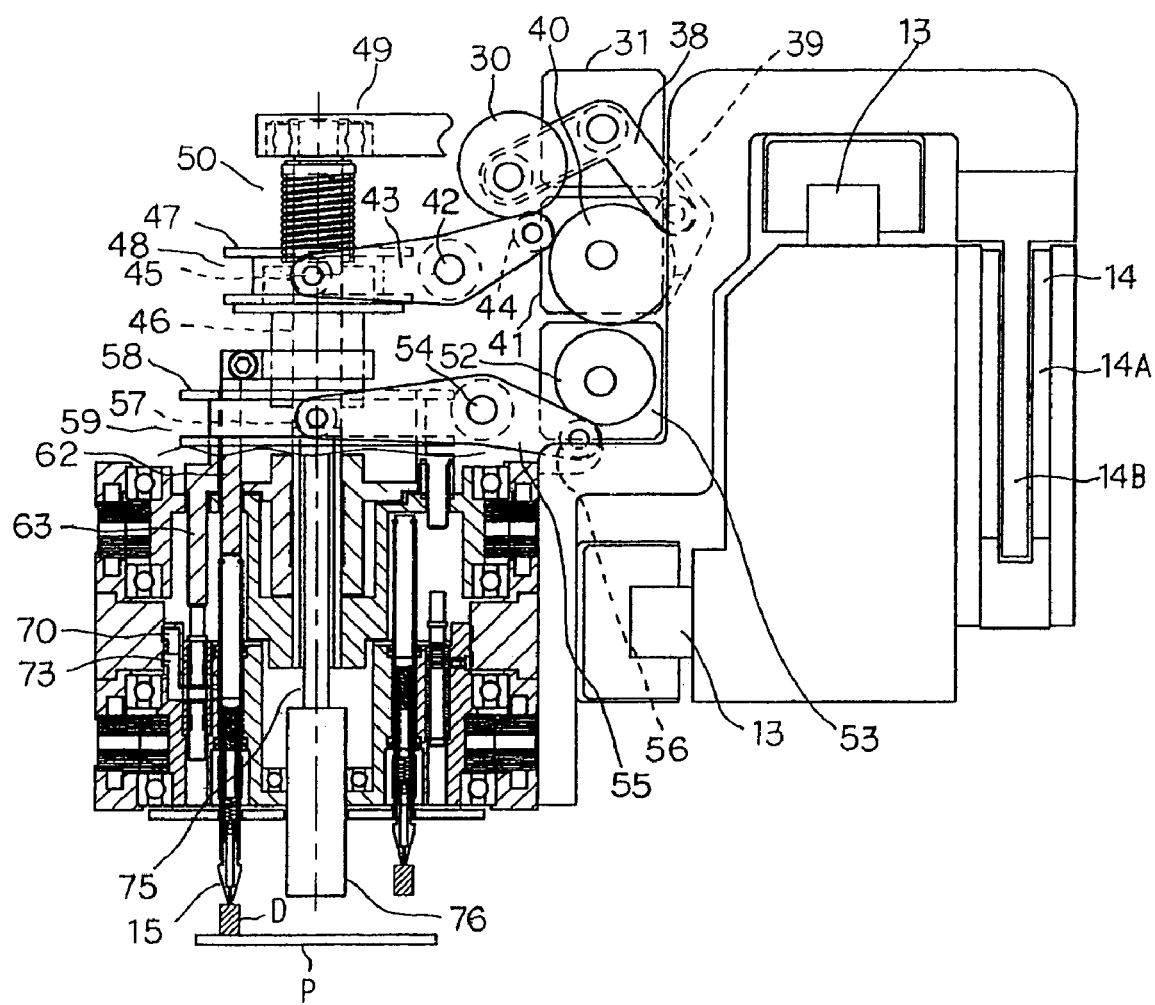
FIG. 9 is a vertical side view of the mounting head body of FIG. 4 mounting the thick electronic component.
Figure 13:
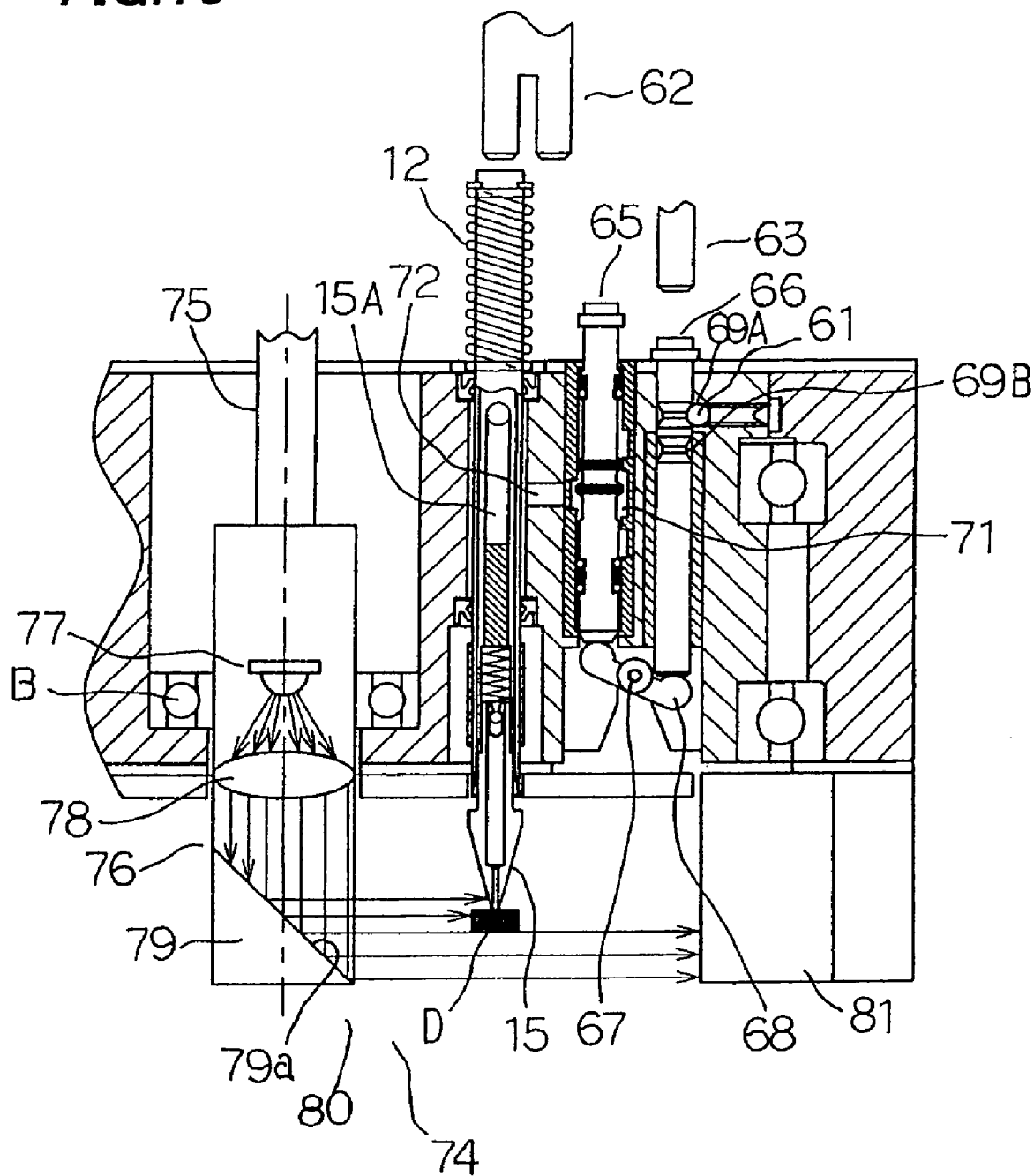
FIG. 13 is a vertical side view of a main portion of the mounting head body of FIG. 4 picking the thin electronic component up by suction.

When the suction nozzle 15 descends for mounting, as shown in FIGS. 7 and 9, turning of the third lever 55 by rotation of the third cam 52 makes the vacuum valve switch operating body 58 descend corresponding to descending of the vertical shift body 47 connected therewith through the cam engagement portion 59. The vertical shift bar 63 of the vacuum valve switch operating body 58 depresses a first switch bar 65 to turn a switch lever 68 around a support axis 67 and to push a second switch bar 66 upward, so that a projected stopper 61 is engaged with a recess for engagement 69B of the second switch bar 66. When picking the electronic component up, as shown in FIGS. 6, 8, and 13, the vertical shift bar 63 of the vacuum valve switch operating body 58 depresses the second switch bar 66 to turn the switch lever 68 around the support axis 67 and to push the first switch bar 65 upward, so that the projected stopper 61 is engaged with a recess for engagement 69A of the second switch bar 66.

At this time, vacuum suction of the electronic component D by the suction nozzle is stopped since a vacuum path is disconnected from a vacuum source and air blows in the suction nozzle 15, in a state where the first switch bar 65 descends by descending of the vertical shift bar 63 of the vacuum valve switch operating body 58 when mounting. On the other hand, vacuum suction of the electronic component D by the suction nozzle 15 is kept since the vacuum path is connected to the vacuum source, in a state where the second switch bar 66 descends.

That is, air from an air supply source blows in an inner path 15A of the suction nozzle 15 through an air path 70, a path 71, and a connecting path 72 in the state where the first switch bar 65 descends. On the contrary, vacuum suction is performed by connecting the inner path 15A of the suction nozzle 15 to the vacuum source through the connecting path 72, the path 71, and a vacuum path 73 in the state where the second switch bar 66 descends.

Figure 14:
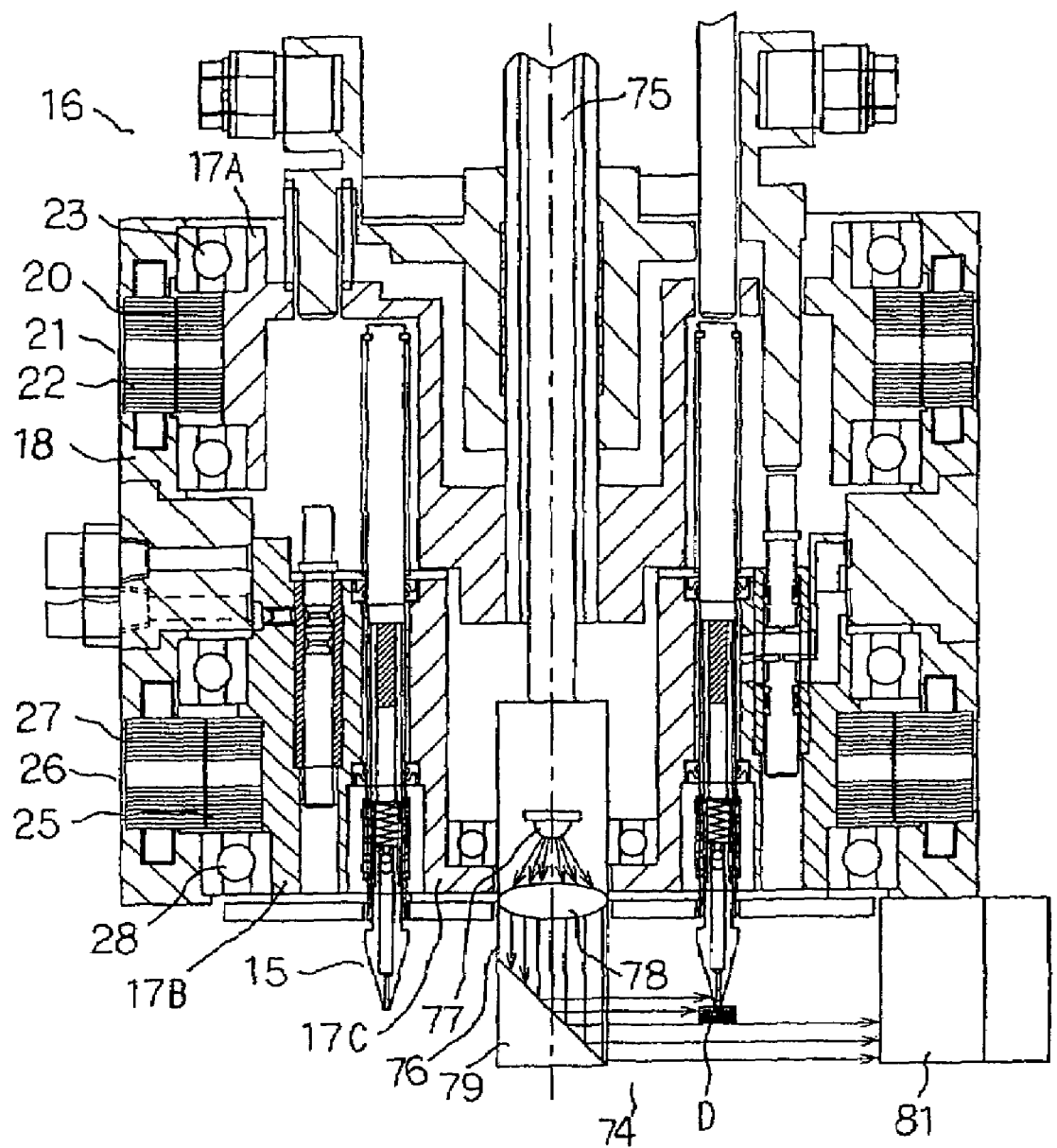
FIG. 14 is a vertical side view of the main portion of FIG. 13 picking the thin electronic component up by suction.

A numeral 74 designates a line sensor unit for detecting presence or absence and an attached position of an electronic component. As shown in FIGS. 13 and 14, the line sensor unit 74 has a light emitting unit 80 and a light receiving unit 81. The light emitting unit 80 has a light emitting element 77 such as an LED in an upper part of a cylindrical light emitting unit attachment body 76, a lens 78 below the light emitting element 77, and a prism 79 having a reflective surface 79a provided with an inclination of 45 degrees below the lens 78. The cylindrical light emitting unit attachment body 76 is provided on a lower end of a strut 75 provided almost in a center of each of the mounting heads 16. Bearings B are provided between the cylindrical light emitting unit attachment body 76 and the third inner cylinder 17C. A light receiving unit 81 has CCD elements as a plurality of receiving elements for receiving light emitted from the light emitting element 77 through the prism 79, being fixed on a bottom of the outer cylinder 18. The mounting head 16 with the line sensor unit 74 can be minimized by disposing the line sensor unit 74 as above.

Figure 15:
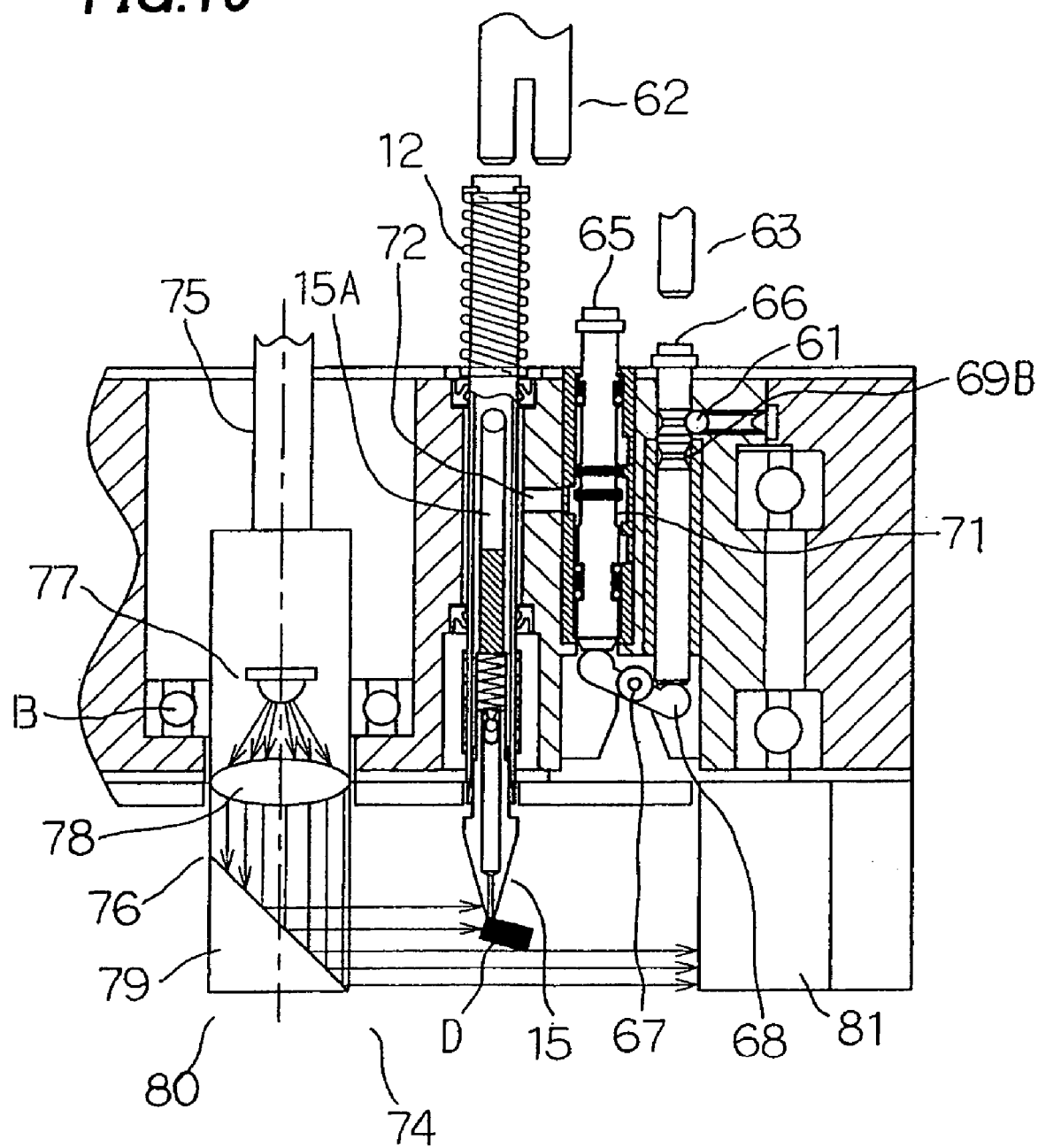
FIG. 15 is a vertical side view of the main portion of FIG. 13 picking an electronic component up in a slanting position.
Figure 16:
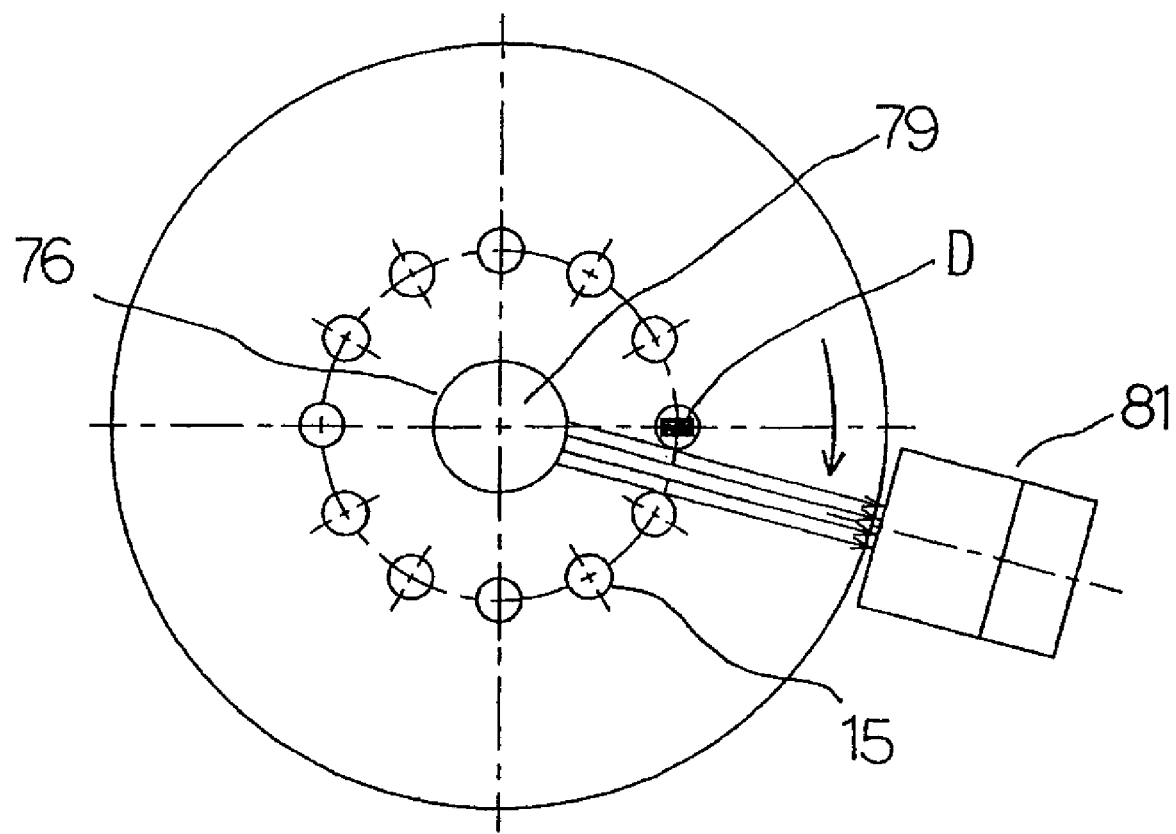
FIG. 16 is a bottom view of FIG. 14.

This enables differentiating of a case where the electronic component is picked up with a normal position as shown in FIG. 13 from a case where the component is picked up with its wrong surface being attached to the suction nozzle, i.e., standing or slanting (FIG. 15), since height of a lower end surface of the electronic component D can be detected by recognizing a border between a light shaded position and a light received position in each of the CCD elements. That is, after the suction nozzle 15 descends, picks up the electronic component D from the component feeding unit 3 by suction, and rises up, the pulse motors 21 and 26 are driven to rotate the mounting head 16. In detail, the first inner cylinder 17A and the second inner cylinder 17B rotate around the strut 75 to rotate the suction nozzle 15 holding the electronic component D by suction. When the electronic component D held by the suction nozzle 15 comes between the prism 79 and the light receiving unit 81 while rotating, presence or absence, an attached position and so on of the component can be detected by detecting height of the lower end surface of the electronic component D at plural positions. Although the detection is performed while rotating and moving of the mounting head 16 in this embodiment, alternatively the detection can be performed with the mounting head 16 being stopped between the prism 79 and the light receiving unit 81.

In a case where the electronic component D is not detected being picked up by the suction nozzle 15, light emitted from the light emitting element 77 is received by the light receiving unit 81. Thus, a detection results in "absence" of the electronic component D so that the vertical shift bar 63 of the vacuum valve switch operating body 58 descends to lower the first switch bar 65 and vacuum suction is stopped by disconnecting the vacuum path from the vacuum source by closing a vacuum valve (not shown), preventing leaking. In a case where the electronic component is detected being attached to the suction nozzle 15 at its wrong surface, i.e., with standing or slanting, the mounting head 16 and the suction nozzle 15 moves to a position above an exhaust box 82, drops the electronic component D therein, and performs a picking process of the electronic component D again. Even in a case where the electronic component is detected being attached properly, a lower end level (lower end position) of the electronic component D can be detected so that a CPU 90 controls the drive motor 31 to change an amount of a descending stroke of the suction nozzle 15 for mounting the component D on the printed board P corresponding to the lower end level. This compensates for variations in type of the components D. In detail, the drive motor 31 is driven to rotate the first cam 30 to set it at a predetermined angle and turn the second lever 43 around the support axis 42 so that the vertical shift body 47 descends and the vertical shift bar 62 lowers the suction nozzle 15 by a predetermined amount of a stroke.

A numeral 83 designates a component recognition camera. The component recognition camera 83 is provided on each of the four mounting heads 16 so that there are four cameras 83 in total. The cameras 83 sequentially take images of all the electronic components D picked up by the suction nozzles 15 to detect an amount of shifting from a proper position of the electronic component D on the suction nozzle 15 in X and Y directions and at rotating angles. Alternatively, the camera 83 can take images of the plurality of the electronic components simultaneously.

As shown in FIG. 3, each of the linear motors 84 is driven, and each of sliders 86 fixed with the component recognition cameras 83 slides along a pair of left and right guides 85 and moves in parallel with a conveying direction of the printed board P and an alignment direction of the component feeding units 3, i.e., in the X direction. Each of the linear motors 84 has a pair of upper and lower stationary members 88 fixed to a mount 87 fixed on the base 2 and a moving member 89 provided in the slider 86.

Figure 4:
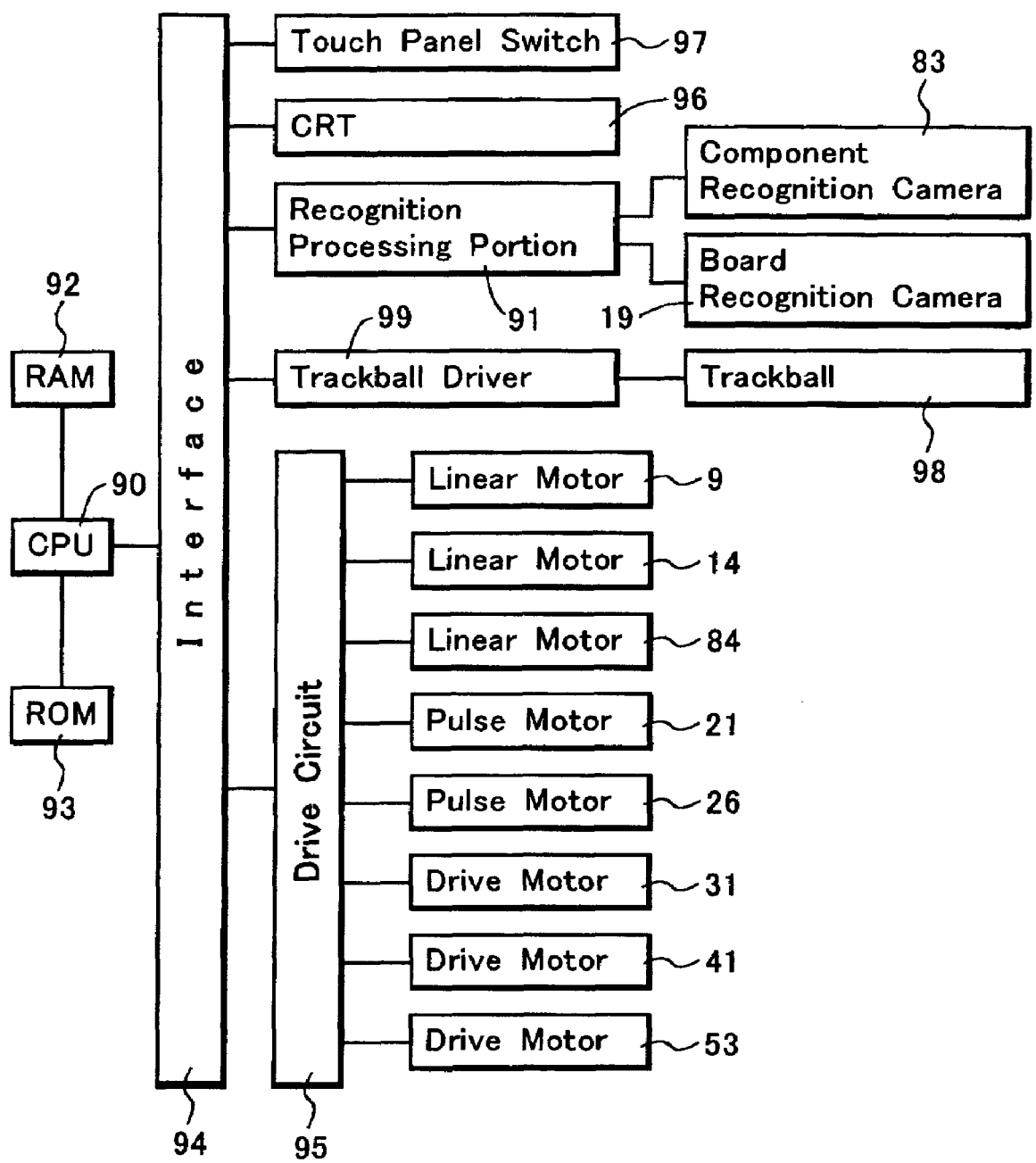
FIG. 4 is a block diagram showing the controlling of the electronic component mounting apparatus of FIG. 1.

Next, description will be made with reference to a block diagram showing controlling of the electronic component mounting apparatus 1 in FIG. 4. A numeral 90 designates the CPU (mounting control portion) as a control portion for controlling the mounting apparatus 1. The CPU 90 is connected with a RAM (random access memory) 92 and a ROM (read only memory) 93 through buses. The CPU 90 controls all operation for component mounting of the electronic component mounting apparatus 1 according to programs stored in the ROM 93 based on data stored in the RAM 92. That is, the CPU 90 controls driving of the linear motors 9, 14, and 84, the pulse motors 21 and 26, and the drive motors 31, 41, and 53 through an interface 94 and a drive circuit 95.

The RAM 92 is stored with mounting data on component mounting which include values in the X and Y directions (indicated by X and Y respectively) and an angle (indicated by Z) on the printed board, alignment numbers of the component feeding units 3, and so on in order of component mounting (in order of step number). Furthermore, the RAM 92 is stored with component disposition data which include a type of the electronic component (component ID), alignment coordinates of the component feeding units 3, and so on corresponding to alignment numbers of the component feeding units 3.

A numeral 91 designates a component recognition processing portion connected with the CPU 90 through the interface 94. In the component recognition processing portion 91, images taken and stored by the component recognition camera 83 and the board recognition camera 19 undergo recognition processing.

The images taken by the component recognition camera 83 and the board recognition camera 19 are displayed on the CRT 96. The CRT 96 is provided with various touch panel switches 97 and an operator operates the touch panel switches 97 for various settings including settings for informing.

The touch panel switches 97 include a glass substrate which is coated with a transparent conductive film on its whole surface and printed with electrodes on its four edges. When an operator touches one of the touch panel switches 97 in a state where minimal electric currents flow on the surface of the touch panel switches 97, current flows change at the four electrodes and coordinates of a touched position are calculated by a circuit board connected with the electrodes. If the calculated coordinates correspond to one of coordinates originally stored in the RAM 92, which will be described later, as a switch for executing a certain operation, the operation is executed.

A numeral 98 designates a trackball as a pointing device connected with the CPU 90 through a trackball driver 99 and the interface 94. The CRT 96 displays images such as a graphic image for visual alignment and a recognized component image.

Figure 17:
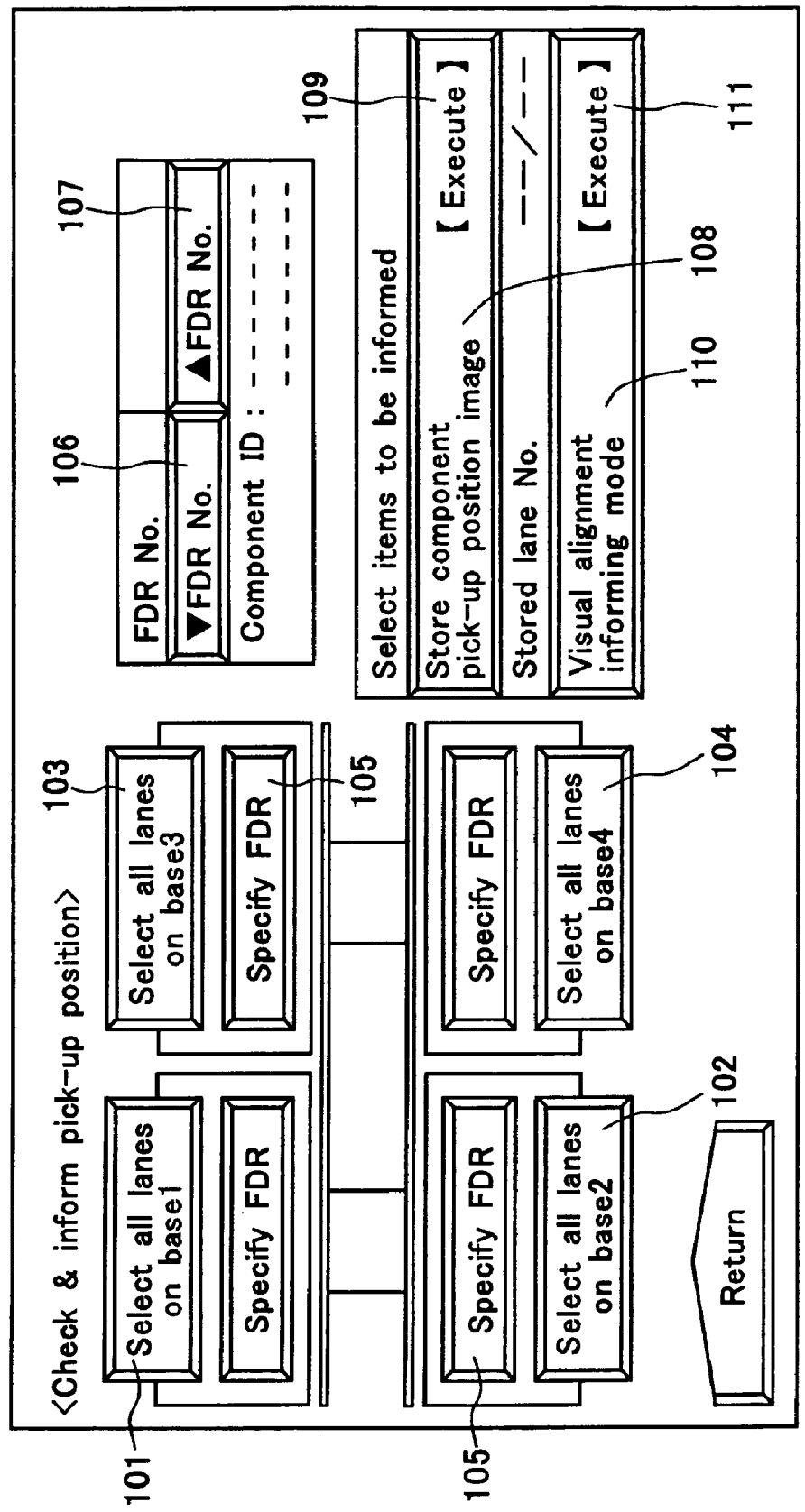
FIG. 17 is a view showing an operating screen displayed on a CRT of the apparatus of FIG. 1.

In the structure as above, when an operator operates a switch for informing the CPU of a pick-up position (not shown) among the touch panel switches 97, an operating screen shown in FIG. 17 is displayed on the CRT 96. On this screen, switches, which will be described below, are provided to form a switching portion for selecting the component feeding units 3 to be performed with checking of a pick-up position and informing of visual alignment. One of the switches is a "select all lanes on base" switch which is for selecting all the lanes by the feeder bases. The "select all lanes on base" switches 101, 102, 103, and 104 are arranged corresponding to a disposition form of the feeder bases 3A, 3B, 3C, and 3D (four blocks) in the mounting apparatus 1 and a plurality of the blocks can also be selected simultaneously. Here, the lane is the component feeding unit 3, and "all lanes" means all the lanes to be used for manufacturing the printed board of certain type so that unused lanes are automatically excluded from targeted lanes to be informed of.

For example, an operator selects the "select all lanes on base" switches 101, 102, 103, and 104 in order to check a pick-up position and inform the CPU of visual alignment for all the lanes to be used for the printed board manufacturing, and selects a "store pick-up position image" switch 108 in a menu of "select items to be informed of" and operates an "execute" switch 109. Then, the CPU 90 selects lanes to be used for manufacturing the printed board of certain type in the selected feeder bases, moves the board recognition camera 19 to a pick-up position (a pick-up position calculated with a current feeder offset value to be aligned) at the lanes, makes the camera 19 sequentially take images of the component feeding positions (the component pick-up positions) of the component feeding units 3 while sequentially moving the camera 19 to each of the lanes, and stores the images therein.

Thus, the feeder bases for taking images can be selected in correspondence to a type of the printed board, and taking of an image and storing of the image can be sequentially performed after targeting lanes to be used. Therefore, time for taking and storing images can be minimized.

Figures 18, 19:
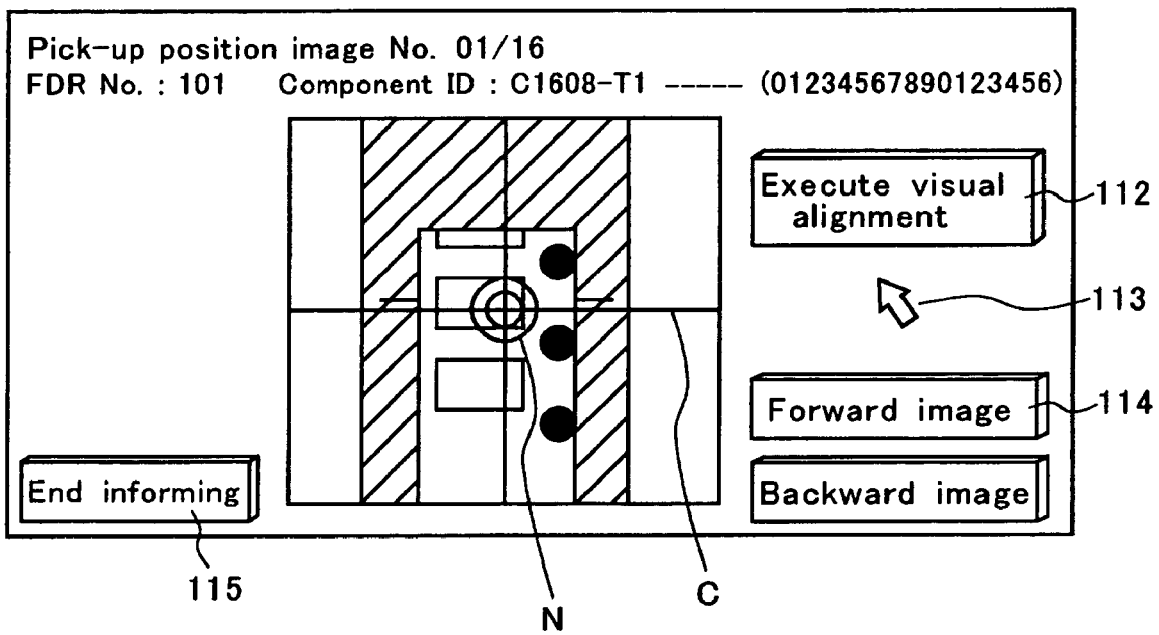
FIG. 18 is a view showing mounting data used with the apparatus of FIG. 1.
FIG. 19 is a view showing a screen for informing of visual alignment displayed on the CRT of FIG. 17.

Targeting of lanes to be used is performed based on mounting data as shown in FIG. 18 which include X abscissas, Y ordinates, angles, and the alignment numbers (FDR number), and so on provided in order of component mounting.

During execution of this operation, executing information is displayed at "stored lane No. --/--" on the screen. In this case, a denominator is a total number of targeted lanes to be informed of and a numerator is a total number of lanes completed with image storing. When completing storing of images of feeding positions (pick-up positions) at all the lanes (when numbers of the denominator and the numerator correspond to each other), the operator operates a "visual alignment informing mode" switch 110 in the menu of "select items to be informed of" and operates an "execute" switch 111, going on to a visual alignment process where the trackball 98 is used for operation.

Figure 20:
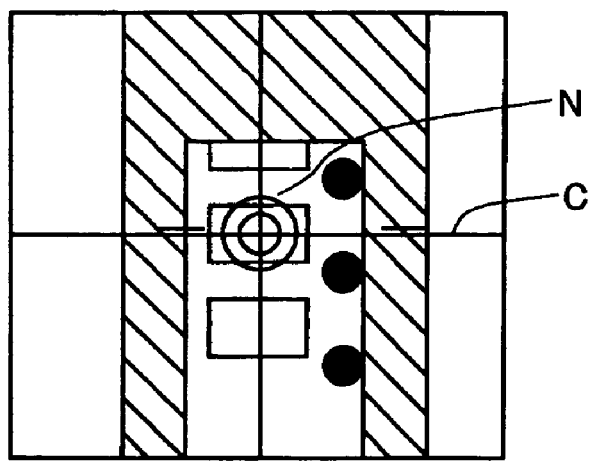
FIG. 20 is a view showing a screen for informing of visual alignment displayed on the CRT of FIG. 17.

In the "visual alignment informing mode", a screen as shown in FIG. 19 is displayed where an image at a component feeding position of the component feeding unit 3 taken by the board recognition camera 19 and a graphic suction nozzle (i.e., a component pick-up position, including a cross line C) are displayed being superimposed on each other. The operator operates the trackball 98 to move a cursor 113 to an "execute visual alignment" menu 112 and clicks a left button of the trackball 98. Then, the stored image (memory image) becomes freely movable in any direction according to a trackball operation. Therefore, as shown in FIG. 20, the operator moves the stored image (memory image) to match the cross line C and an outline N of the graphic suction nozzle (component pick-up position) for visual alignment with the component feeding position.

After matching, the operator simultaneously pushes right and left buttons of the track ball 98 to store an alignment value of the position in the RAM 92. By this operation, a difference (X, Y) in the position between the original image and the aligned image is extracted and the offset value of the pick-up position at the target lane is updated.

The operator clicks the left button of the trackball 98 at a "forward image" menu 114 to display a next screen for a next lane, and repeats the visual alignment of the pick-up position similarly. The operator can repeat this image forwarding operation if the alignment is not needed.

A denominator "16" of a "pick-up position image No. 01/16" shown in FIG. 19 indicates that there are 16 lane images stored, and a numerator indicates each of consecutive numbers thereof. As forwarding the images for display, the FDR number and the component ID of the displayed image are displayed.

When completing the visual alignment of the pick-up position, the operator clicks the left button of the trackball 98 at an "end informing" menu 115 on a left lower side of the screen to end the visual alignment informing mode. The screen returns to an ordinal operation mode.

Figure 21:
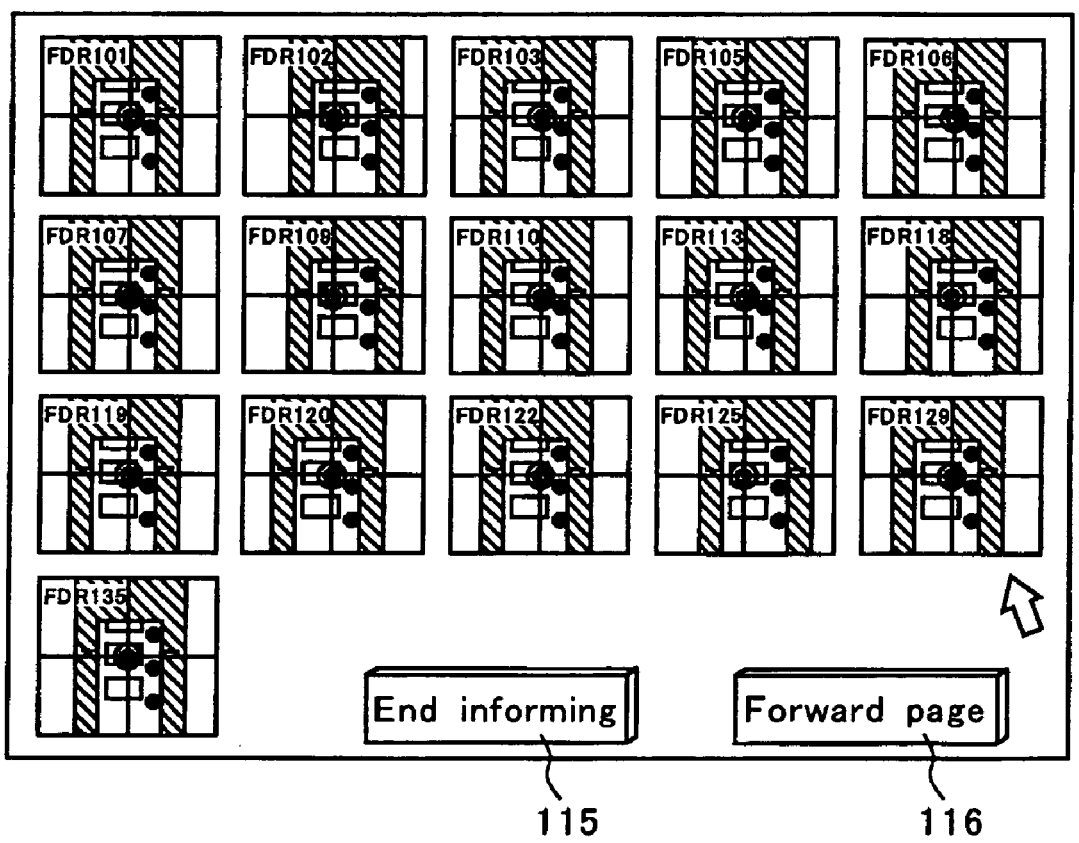
FIG. 21 is a view showing other screen for informing of visual alignment displayed on the CRT of FIG. 17.
Figure 22:
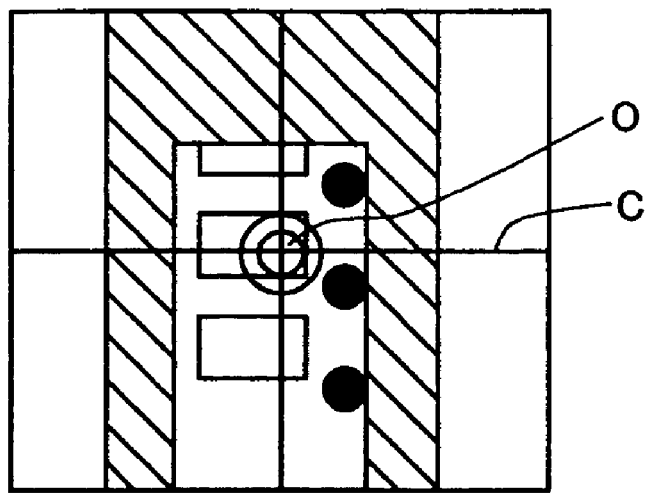
FIG. 22 is a view showing a screen for informing of visual alignment displayed on a CRT in a conventional art.
Figure 23:
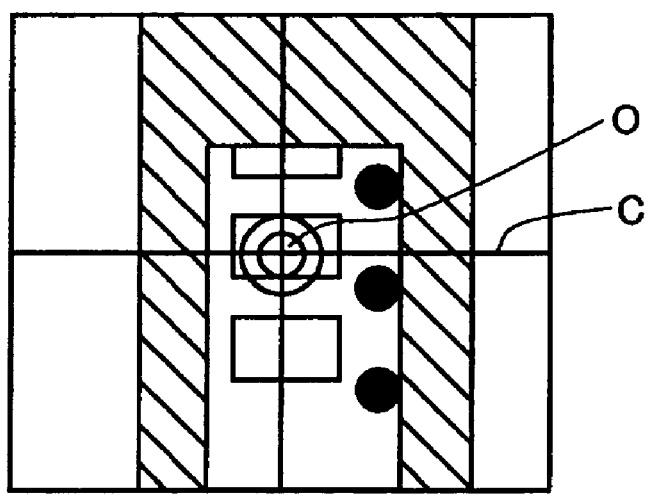
FIG. 23 is a view showing a screen for informing of visual alignment displayed on a CRT in the conventional art.

As shown in FIG. 21, in the visual alignment informing mode, the stored images (including the graphic suction nozzles) can be all displayed with aligning on the CRT 96 to check the pick-up positions, and lanes to be informed of can be selected by clicking the left button directly at each area of the images on the screen to shift to the visual alignment. If a reduced image makes it difficult to check the pick-up position, each area of the images can be enlarged on the screen as appropriate to facilitate visual check and alignment.

If all the images can not be displayed in one page of the screen, the operator clicks the left button of the trackball 98 at a "forward page" menu 116 to shift to a next page. In this example, lanes where the feeding position and the pick-up position do not match can be detected soon and focused on, so that operating efficiency is more increased.

When checking the pick-up position and informing the CPU of visual alignment by the lanes, the operator selects a "specify FDR" switch 105 and then specifies a lane number (FDR number) to be performed by operating a "forward/backward of FDR number" key on an upper-right side of the screen. That is, a "▼ FDR No." switch 106 and a "▲ FDR No." switch 107 are respectively a forward key and a backward key of the number of lanes used for the printed board manufacturing, and the number of unused lanes are automatically skipped. An area showing "component ID" thereunder is for displaying a component ID name of the specified FDR number.

After specifying the number of the lane (FDR number) to be performed, the operator selects and operates the "store component pick-up position image" 108 in the menu of the "select items to be informed of" and then the "execute" switch 109. Then, the CPU 90 searches a selected lane and moves the board recognition camera 19 to a pick-up position (a position calculated with a current feeder offset value to be aligned) at the selected lane, makes the camera 19 take an image of the component feeding position of the component feeding units 3, and stores the images therein. When completing storing of the image of the component feeding position (component pick-up position), the operator operates the "visual alignment informing mode" switch 110 and then the "execute" switch 111, going on to the visual alignment process where the trackball 98 is used for operation.

In the "visual alignment informing mode", a screen as shown in FIG. 19 is displayed on the CRT 96, and the operator operates the trackball 98 to move the cursor 113 to the "execute visual alignment" menu 112 and clicks the left button of the trackball 98. Then, the stored image (memory image) becomes freely movable in any direction according to a trackball operation. Therefore, as shown in FIG. 20, the operator moves the stored image (memory image) to match the cross line C and the outline N of the graphic suction nozzle (component pick-up position) for visual alignment with the component feeding position.

After matching, the operator simultaneously pushes the right and left buttons of the track ball 98 to store an alignment value of the component pick-up position in the RAM 92. By this operation, a difference (X, Y) in the position between the original image and the aligned image is extracted and the offset value of the component pick-up position at the target lane is updated.

Thus, alignment informing operation is completed by updating the offset value of the pick-up position at the target lane. Therefore, ordinal picking-up and mounting operation can be started in this state. That is, the feed conveyer 4 conveys a printed board P received from an upstream to the positioning portion 5 with a conveyer (not shown), and a positioning device (not shown) in the positioning portion 5 starts positioning the printed board P.

Next, the CPU 90 forms pick-up sequence data from the mounting data stored in the RAM 92. That is, the CPU 90 reads out data from the mounting data, decides a picking-up procedure of the suction nozzles 15, detects the last component feeding unit 3 which feeds the last electronic component D in a sequential picking-up process (12 components for one mounting head 16 at maximum) and stores coordinates of a last pick-up position of the component feeding unit 3 in the RAM 92, detects coordinates of a first mounting position of the component D after completing a sequential picking-up process (a position in mounting data before alignment) and stores the coordinates, and calculates an X abscissa of a position which the component recognition cameras 83 should move to.

This is for driving and moving the component recognition cameras 83 (two cameras) in the X direction so that the cameras 83 can be previously positioned on a line which connects the last pick-up position of the component by the mounting head 16 and the first mounting position of the component on the printed board P, in a sequential picking-up process. Thus, the camera 83 can simultaneously take images of all the electronic components picked up by the suction nozzles 15 of the left and right mounting heads 16 by "on-fly recognition without stopping of the beam 8" while the beam 8 is moving from the last pick-up position to the first mounting position. This prevents wasting of time for moving the beam 8 for shifting to a component recognition process.

Accordingly, after calculating the X abscissa of the position which the component recognition cameras 83 should move to, the cameras 83 is moved to the calculated position. Then, picking-up of the electronic component D is performed.

That is, the suction nozzles 15 pick up the electronic components to be mounted from the predetermined component feeding unit 3 according to the mounting data stored in the RAM 92 where a position of an X abscissa and a Y ordinate on the printed board to be mounted with the component, a position at a rotation angle around a vertical axis, an alignment number and so on are specified. For this pick-up operation, the suction nozzle 15 of the mounting head 16 in the mounting head body 7 moves to a position above the first electronic component in the component feeding unit 3 which has the electronic components to be mounted. This movement is performed based on the updated offset value of the pick-up position at the target lane (component feeding unit 3) by a visual alignment informing process described above. Each of the head bodies 7 is moved in the Y direction by moving of the beam 8 along the pair of the guides 10 driven by the linear motor 9 and in the X direction along the guides 13 driven by the linear motor 14, both the linear motors 9 and 14 being driven by the drive circuit 95.

At this time, the predetermined component feeding unit 3 is already driven and the electronic component is ready to be picked up at a feeding position of the unit 3. The suction nozzle 15 is selected by rotating of the first inner cylinder 17A and the second inner cylinder 17B of the mounting head 16 driven by the pulse motors 21 and 26, and positioned on one of 0, 3, 6, and 9 o'clock positions in the mounting head 16 and above the component feeding position of the component feeding unit 3. The first cam 30 rotates to set at a predetermined angle driven by the drive motor 31, the second lever 43 turns around the support axis 42, and the vertical shift body 47 descends to lower the vertical shift bar 62 so that the suction nozzle 15 descends by a predetermined stroke to firmly pick the electronic component D up from the component feeding unit 3. Then, the first cam 30 rotates to set at a predetermined angle and the second lever 43 turns so that the vertical shift body 47 rises up to raise the suction nozzle 15.

At this time, the third cam 52 rotates driven by the drive motor 53 to turn the third lever 55, the vacuum valve switch operating body 58 descends corresponding to descending of the vertical shift body 47, and the vertical shift bar 63 descends to push the second switch bar 66 downward. Then, the inner path 15A of the suction nozzle 15 becomes connected to the vacuum source through the connecting path 72, the path 71, and the vacuum path 73, so that the suction nozzle 15 picks the electronic component D up from the component feeding unit 3 by vacuum suction and rises up with the electronic component D. The mounting head 16 rotates driven by the pulse motors 21 and 26, and the first inner cylinder 17A and the second inner cylinder 17B turn around the strut 75 to rotate the suction nozzle 15 holding the electronic component D. The electronic component D picked-up by the suction nozzle 15 comes between the prism 79 and the light receiving unit 81, and detecting of presence or absence or an attached position of the electronic component D is performed by detecting height of a lower end surface of the electronic component D at plural positions.

In a case where the electronic component is detected being attached to the suction nozzle 15 at its wrong surface or with slanting (FIG. 15), the mounting head 16 and the suction nozzle 15 moves above the exhaust box 82, drops the electronic component D therein, and perform picking operation of the electronic component D again. Even in a case where the electronic component D is detected being attached properly, while keeping vacuum suction, a lower end level (lower end position) of the electronic component D can be detected so that the CPU 90 controls the drive motor 31 to change an amount of a descending stroke of the suction nozzle 15 for mounting the component D on the printed board P corresponding to the lower end level. This compensates for variations in type of the components D. That is, the drive motor 31 is driven to rotate the first cam 30 to set it at a predetermined angle and turn the second lever 43 around the support axis 42 so that the vertical shift body 47 descends and the vertical shift bar 62 lowers the suction nozzle 15 by a predetermined amount of a stroke for mounting of the electronic component D. This prevents the printed board P from being applied with pressure in excess.

When sequential pick-up operation is performed by the mounting head 16, the suction nozzle 15 with the component D is not lowered for mounting the component D but the pulse motors 21 and 36 are driven to rotate the mounting head 16 and to move the suction nozzle 15 selected for next pick-up operation to a position above a component feeding position of the component feeding unit 3. Then, as described above, the first cam 30 rotates and the vertical shift bar 62 descends so that the selected suction nozzle 15 descends by a predetermined stroke, picks the electronic component D up from the component feeding unit 3, and rises up. Detecting of presence or absence or an attached position of the electronic component D is performed by the line sensor unit 74 as above.

Then, multiple picking (sequentially picking the components up as much as possible) is sequentially performed, similarly. When completing this multiple picking-up operation, the CPU 90 forms mounting sequence data and moves the beam 8 and the mounting head 16 to a first mounting position where the component D is mounted on the printed board P first. That is, the CPU 90 stores coordinates of the first mounting position (a position stored in the mounting data before alignment of a pick-up position), where the electronic component D is mounted first, in the RAM 92 and set it as a coordinate value of a moving target position. Then, the CPU 90 moves the component recognition cameras 83 on a line which connects the last pick-up position of the component by the mounting head 16 and the first mounting position of the component on the printed board P.

Then, when the CPU 90 detects timing for the component recognition camera 83 to taka images, that is, timing where the mounting head 16 passes above the camera 83, the CPU makes the camera 83 positioned on the line simultaneously take and store images of all the electronic components D picked up by the suction nozzles 15 of the left and right mounting heads 16 by "on-fly recognition without stopping of the beam 8" while the beam 8 is moving from the last pick-up position to the first mounting position. Then, the component recognition processing portion 91 starts a component recognition process.

When a recognition result for the first component to be mounted is calculated by the component recognition processing portion 91, the CPU detects whether the suction nozzle 15 is positioned on a first mounting position (a position in mounting data before alignment of a pick-up position) which is set as the coordinate value of the moving target position. If positioned, the CPU resets the coordinate value into a coordinate value of a moving target position calculated with the recognition (alignment) result and moves the beam 8 for positioning the suction nozzle 15 on a position of the reset target value. If not positioned, the set coordinate value of the moving target position is dynamically changed to the coordinate value calculated with the recognition (alignment) result.

When completing moving of the beam 8, the first electronic component D among the components D sequentially picked up by the suction nozzle 15 is mounted on the printed board P.

That is, the first cam 30 rotates driven by the drive motor 31 and the second cam 40 rotates driven by the drive motor 41, the second lever 43 turns to set at a predetermined angle around the support axis 42, and the vertical shift body 47 descends to lower the vertical shift bar 62. Thus, the suction nozzle 15 descends by a predetermined stroke corresponding to a thickness of the electronic component D and a lower end level thereof detected by the line sensor unit 74 and mounts the electronic component D on the printed board P (FIGS. 7 and 9).

On this mounting process, the vertical shift bar 63 of the vacuum valve switch operating body 58 descends to push the first switch bar 65 downward so that the vacuum path is disconnected from the vacuum source to stop the vacuum suction and air from the air supply source blows in the inner path 15A of the suction nozzle 15 through the air path 70, the path 71, and the connecting path 72. That is, when descending of the suction nozzle 15 for mounting, third cam 52 rotates to turn the third lever 55 and the vacuum valve switch operating body 58 descends corresponding to descending of the vertical shift body 47 through the cam engagement portion 59. Then, the vertical shift bar 63 of the operation body 58 pushes the first switch bar 65 downward, and the switch lever 68 turns around the support axis 67 to push the second switch bar 66 upward. The projected stopper 61 is engaged with the recess for engagement 69B of the second switch bar 66 so that the vacuum path is disconnected from the vacuum source to stop the vacuum suction.

The CPU 90 calculates next mounting operation of the electronic component D and repeats the mounting operation until all the picked electronic components D are mounted. That is, the CPU 90 receives a recognition result calculated by the component recognition processing portion 91, calculates a coordinate value of a moving target position in X, Y, and θ. Then, the CPU 90 drives the linear motor 9 to move the beam 8 in the Y direction to a target coordinate value calculated with the recognition result, drives the linear motor 14 to move the mounting head 16 in the X direction, and drives the pulse motors 21 and 26 to rotate the suction nozzle 15 to set at a θ angle. The first cam 30 and the second cam 40 rotates so that the suction nozzle 15 descends by a predetermined stroke corresponding to a thickness of the electronic component D and mounts the electronic component D on the printed board P. The CPU repeats this operation until all the electronic components D picked up by the suction nozzle 15 of the mounting head 16 are mounted.

If all the components D specified in the mounting data are not mounted on the printed board P, the CPU forms pick-up sequential data again, and executes picking-up operation of the electronic components D, component recognition, and mounting. If all the components D specified in the mounting data are mounted on the printed board P, the CPU 90 returns the beam 8 to an original position and mounts the completed printed board P on the discharge conveyer 6, terminating mounting operation.

In this embodiment, the stored image (memory image) is moved to match the cross line C and the outline N of the graphic suction nozzle (component pick-up position) for visual alignment with a component feeding position. Alternatively, the cross line C and the outline N of the graphic suction nozzle (component pick-up position) for visual alignment can be moved on the CRT 96 to match the component pick-up position with a component feeding position.

Although particular preferred embodiments of the invention have been disclosed in detail, it is recognized that variations or modifications of the disclosed apparatus, including the rearrangement of parts, are possible based on the embodiments disclosed and that these variations and modifications are within the scope of the invention.

What is claimed is:

1. An electronic component mounting apparatus, comprising:
   a plurality of component feeding units feeding electronic components and aligned on a base;
   a mounting head provided with suction nozzles, the mounting head being movable between the component feeding units and a printed board positioning portion, and the suction nozzles picking the electronic components up from the component feeding units;
   a recognition camera taking images of component feeding positions of the component feeding units;
   a command device commanding the recognition camera to sequentially take images of the component feeding positions of the component feeding units so that the taken images are stored prior to a start of a mounting operation;
   a display device displaying each of the images taken by the recognition camera with a graphic image of a component pick-up position;
   a position matching device for matching the component feeding positions with the corresponding component pick-up positions by moving the image taken or the graphic image on the display device for visual alignment;
   a storage portion storing shift amounts detected by the position matching device; and
   a control device controlling alignments of the component pick-up positions with respect to the suction nozzles based on the shift amounts stored in the storage portion,
   wherein the command device is configured to have the display device show the stored images successively in response to an action by a user prior to the start of the mounting operation.

2. The electronic component mounting apparatus of claim 1, wherein the control device selects the component feeding positions of the component feeding units which feed the electronic components to be mounted on a printed board placed on the printed board positioning portion and makes the recognition camera take images of the selected component feeding positions.

3. An electronic component mounting apparatus, comprising:
   a plurality of component feeding units feeding electronic components, each of the component feeding units being aligned on a corresponding feeder base;
   a mounting head provided with suction nozzles, the mounting head being movable between the component feeding units and a printed board positioning portion, and the suction nozzles picking the electronic components up from the component feeding units;
   a recognition camera taking images of component feeding positions of the component feeding units;
   a command device commanding the recognition camera to take images of the component feeding positions of the component feeding units in one sequence for each of the feeder bases so that the taken images are stored prior to a start of a mounting operation;
   a display device displaying each of the images taken by the recognition camera with a graphic image of a component pick-up position;
   a position matching device for matching the component feeding positions with the corresponding component pick-up positions by moving the image taken or the graphic image on the display device for visual alignment;
   a storage portion storing shift amounts detected by the position matching device; and
   a control device controlling alignments of the component pick-up positions with respect to the suction nozzles based on the shift amounts stored in the storage portion,
   wherein the command device is configured to have the display device show the stored images successively in response to an action by a user prior to the start of the mounting operation.

4. The electronic component mounting apparatus of claim 3, wherein the control device selects the component feeding positions of the component feeding units which feed the electronic components to be mounted on a printed board placed on the printed board positioning portion and makes the recognition camera take images of the selected component feeding positions.

5. An electronic component mounting apparatus, comprising:
   a plurality of component feeding units feeding electronic components and aligned on a base;
   a mounting head provided with suction nozzles, the mounting head being movable between the component feeding units and a printed board positioning portion, and the suction nozzles picking the electronic components up from the component feeding units;
   a recognition camera taking images of component feeding positions of the component feeding units;
   a command device commanding the recognition camera to sequentially take images of the component feeding positions of the component feeding units;
   a display device collectively displaying all the images of the component feeding positions taken by the recognition camera with graphic images of component pick-up positions;
   a position matching device for matching the component feeding positions with the corresponding component pick-up positions by moving the image taken or the graphic image on the display device for visual alignment;

a storage portion storing shift amounts detected by the position matching device; and a control device controlling alignments of the component pick-up positions with respect to the suction nozzles based on the shift amounts stored in the storage portion.

* * * * *